US012211943B2

(12) United States Patent
Seo et al.

(10) Patent No.: US 12,211,943 B2
(45) Date of Patent: Jan. 28, 2025

(54) DISPLAY DEVICE AND METHOD OF MANUFACTURING THE SAME

(71) Applicant: Samsung Display Co., Ltd., Yongin-Si (KR)

(72) Inventors: Jong Oh Seo, Seoul (KR); Jang Hyun Kim, Hwaseong-si (KR); Jae Woo Jeong, Suwon-si (KR); Jong Hoon Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 366 days.

(21) Appl. No.: 17/665,350

(22) Filed: Feb. 4, 2022

(65) Prior Publication Data

US 2023/0005966 A1 Jan. 5, 2023

(30) Foreign Application Priority Data

Jul. 5, 2021 (KR) ........................ 10-2021-0087655

(51) Int. Cl.
*H01L 29/786* (2006.01)
*H01L 27/12* (2006.01)
*H10K 59/121* (2023.01)

(52) U.S. Cl.
CPC ...... *H01L 29/78696* (2013.01); *H01L 27/127* (2013.01); *H10K 59/1213* (2023.02)

(58) Field of Classification Search
CPC .................. H01L 29/78696; H10K 59/1213
See application file for complete search history.

(56) References Cited

U.S. PATENT DOCUMENTS

2007/0126000 A1\* 6/2007 Lin ...................... H01L 27/1296
257/40

FOREIGN PATENT DOCUMENTS

KR 10-2184448 B1 12/2020
KR 10-2022-0085070 A 6/2022

OTHER PUBLICATIONS

Byeong-Koo Kim, et al., "Recoverable Residual Image Induced by Hysteresis of Thin Film Transistors in Active Matrix Organic Light Emitting Diode Displays," Japanese Journal of Applied Physics, 2004, vol. 43, No. 4A, pp. L482-L485, the Japan Society of Applied Physics.

\* cited by examiner

*Primary Examiner* — Peter M Albrecht
(74) *Attorney, Agent, or Firm* — Innovation Counsel LLP

(57) ABSTRACT

A display device includes a substrate, a semiconductor layer, an insulating layer, and a conductive layer. The semiconductor layer is disposed on the substrate, includes a channel of a first transistor, and includes a channel of a second transistor. The insulating layer is disposed on the semiconductor layer. The conductive layer is disposed on the insulating layer, includes a gate electrode of the first transistor, and includes a gate electrode of the second transistor. The channel of the first transistor includes a first first-element impurity ion and a second-element impurity ion different from the first first-element impurity ion. The channel of the second transistor includes a second first-element impurity ion identical to the first first-element impurity ion.

15 Claims, 14 Drawing Sheets

DISPLAY DEVICE AND METHOD OF MANUFACTURING THE SAME

CROSS-REFERENCE TO RELATED APPLICATION

This application claims priority to Korean Patent Application No. 10-2021-0087655 filed on Jul. 5, 2021, in the Korean Intellectual Property Office; the Korean Patent Application is incorporated by reference.

BACKGROUND

Technical Field

The technical field relates to a display device and a method of manufacturing the display device.

Description of the Related Art

A display device may display an image in response to input signals. Display devices may be applied to various electronic devices, such as phones, digital cameras, laptop computers, navigator, and televisions.

Modern display devices include liquid crystal display (LCD) devices and organic light emitting display (OLED) devices. A display device may include transistors that provide currents to light emitting/controlling elements for displaying images.

SUMMARY

According to an embodiment, a display device comprises a substrate, a semiconductor layer disposed on the substrate, comprising a channel of a first transistor and a channel of a second transistor, a first insulating layer disposed on the semiconductor layer, and a first conductive layer disposed on the first insulating layer, comprising a gate electrode of the first transistor and a gate electrode of the second transistor. Each of the channel of the first transistor and the channel of the second transistor comprises a first impurity ion. The channel of the first transistor further comprises a second impurity ion different from the first impurity ion.

The first impurity ion may include a group-III element, and the second impurity ion may include a group-V element.

The first impurity ion may include boron (B), and the second impurity ion may include phosphorus (P).

The first impurity ion may include a group-V element, and the second impurity ion may include a group-III element.

The first impurity ion may include phosphorus (P), and the second impurity ion may include boron (B).

The channel of the second transistor may be treated with hydrogen plasma.

A hydrogen content of the channel of the second transistor may be greater than that of the channel of the first transistor.

The first transistor may comprise a first electrode and a second electrode. The second transistor may be disposed between the second electrode of the first transistor and the gate electrode of the first transistor.

The display device may further comprise a first power voltage line electrically connected with the first electrode of the first transistor, and a light emitting element electrically connected with the second electrode of the first transistor.

According to an embodiment, a display device comprises a first power voltage line, a light emitting element, a first transistor comprising a first electrode electrically connected with the first power voltage line, a second electrode electrically connected with the light emitting element, a gate electrode and a channel, and a second transistor disposed between the second electrode of the first transistor and the gate electrode of the first transistor, comprising a channel. Each of the channel of the first transistor and the channel of the second transistor comprises a first impurity ion. The channel of the first transistor further comprises a second impurity ion different from the first impurity ion.

The first impurity ion may include a group-III element, and the second impurity ion may include a group-V element.

The first impurity ion may include boron (B), and the second impurity ion may include phosphorus (P).

The first impurity ion may include a group-V element, and the second impurity ion may include a group-III element.

The first impurity ion may include phosphorus (P), and the second impurity ion may include boron (B).

The display device may further comprise a data line, and a third transistor disposed between the data line and the first electrode of the first transistor. The third transistor comprises a channel, and the channel of the third transistor includes the same material as that of the channel of the second transistor.

According to an embodiment, a method of manufacturing a display device comprises doping a semiconductor layer comprising a first doping area and a second doping area. The first doping area and the second doping area are doped with a first impurity ion, and the first doping area is further doped with a second impurity ion different from the first impurity ion.

The doping a semiconductor layer may comprise doping the first doping area with the first impurity ion and the second impurity ion, and doping the second doping area with the first impurity ion.

The doping a semiconductor layer may comprise doping the first doping area and the second doping area with the first impurity ion, and doping the first doping area with the second impurity ion.

The first impurity ion may include boron (B), and the second impurity ion may include phosphorus (P).

The first impurity ion may include phosphorus (P), and the second impurity ion may include boron (B).

An embodiment may be related to a display device. The display device may include a substrate, a semiconductor layer, a first insulating layer, and a first conductive layer. The semiconductor layer may be disposed on the substrate, may include a channel of a first transistor, and may include a channel of a second transistor. The first insulating layer may be disposed on the semiconductor layer. The first conductive layer may be disposed on the first insulating layer, may include a gate electrode of the first transistor, and may include a gate electrode of the second transistor. The channel of the first transistor may include a first first-element impurity ion and a second-element impurity ion different from the first first-element impurity ion. The channel of the second transistor may include a second first-element impurity ion identical to the first first-element impurity ion.

The first first-element impurity ion may include a group-III element. The second-element impurity ion may include a group-V element.

The first first-element impurity ion may include boron (B). The second-element impurity ion may include phosphorus (P).

The first first-element impurity ion may include a group-V element. The second-element impurity ion may include a group-III element.

The first first-element impurity ion may include phosphorus (P). The second-element impurity ion may include boron (B).

The channel of the second transistor may include hydrogen.

The channel of the second transistor may include more hydrogen than the channel of the first transistor.

The first transistor may include a first electrode and a second electrode. The second transistor may be disposed between the second electrode of the first transistor and the gate electrode of the first transistor.

The display device may include the following elements: a first power voltage line electrically connected to the first electrode of the first transistor; and a light emitting element electrically connected to the second electrode of the first transistor.

An embodiment may be related to a display device. The display device may include a first power voltage line, a light emitting element, a first transistor, and a second transistor. The first transistor may include a first electrode, a second electrode, a gate electrode, and a channel. The first electrode of the first transistor may be electrically connected to the first power voltage line. The second electrode of the first transistor may be electrically connected to the light emitting element. The gate electrode of the first transistor may overlap the channel of the first transistor. The channel of the first transistor may include a first first-element impurity ion and a second-element impurity ion different from the first first-element impurity ion. The second transistor may be disposed between the second electrode of the first transistor and the gate electrode of the first transistor and may include a channel. The channel of the second transistor may include a second first-element impurity ion identical to the first first-element impurity ion.

The first first-element impurity ion may include a group-III element. The second-element impurity ion may include a group-V element.

The first first-element impurity ion may include boron (B). The second-element impurity ion may include phosphorus (P).

The first first-element impurity ion may include a group-V element. The second-element impurity ion may include a group-III element.

The first first-element impurity ion may include phosphorus (P). The second-element impurity ion may include boron (B).

The display device may include the following elements: a data line; and a third transistor disposed between the data line and the first electrode of the first transistor and including a channel. A material of the channel of the third transistor may be identical to a material of the channel of the second transistor.

An embodiment may be related to a method of manufacturing a display device. The method may include the following steps: doping a first area of a semiconductor layer with a first first-element impurity ion; doping a second area of the semiconductor layer with a second first-element impurity ion identical to the first first-element impurity ion; and doping the first area of the semiconductor layer with a second-element impurity ion different from the first first-element impurity ion.

The method may include the following steps: doping the first area of the semiconductor layer with the first first-element impurity ion and the second-element impurity ion simultaneously in a first doping process; and doping the second area of the semiconductor layer with the second first-element impurity ion in a second doping process subsequent to or prior to the first doping process.

The method may include the following steps: doping the first area of the semiconductor layer and the second area of the semiconductor layer with the first first-element impurity ion and the second first-element impurity ion, respectively and simultaneously, in a first doping process; and doping the first area with the second-element impurity ion in a second doping process prior to or subsequent to the first doping process.

The first first-element impurity ion may include boron (B). The second-element impurity ion may include phosphorus (P).

The first first-element impurity ion may include phosphorus (P). The second-element impurity ion may include boron (B).

In a display device according to one or more embodiments, characteristics of a switching transistor may be desirable, For example, the hysteresis of the switching transistor may be minimized. Advantageously, the duration of an unwanted instant afterimage may be minimized.

DETAILED DESCRIPTION

Figure 1:
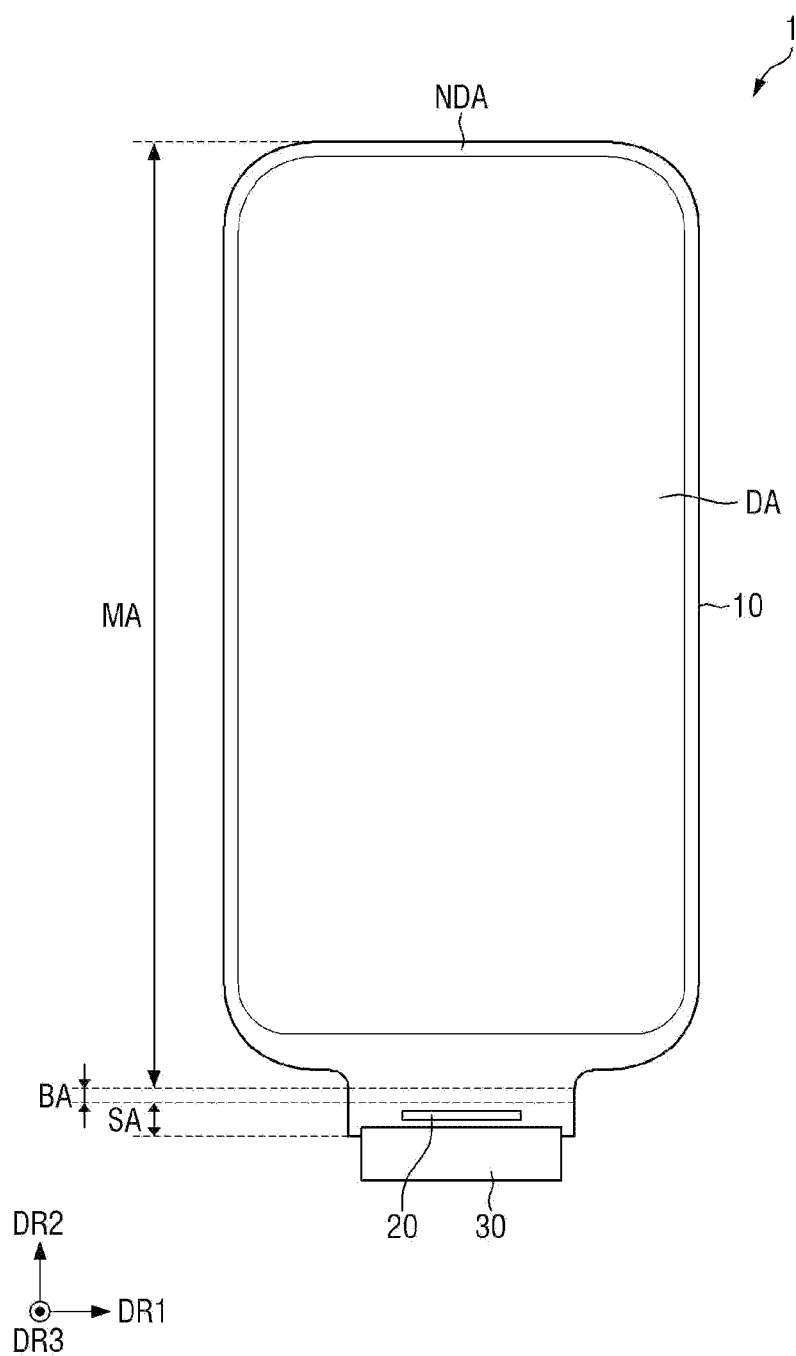
FIG. 1 is a plan view illustrating a display device according to one embodiment.

Examples of embodiments are described with reference to the accompanying drawings. In the accompanying drawings, dimensions may be exaggerated for clarity and/or descriptive purposes. Like reference numerals may denote like elements. Specific configurations and/or characteristics of an embodiment may be used or implemented in other embodiments. Various changes may be made to the described embodiments.

When an embodiment may be implemented differently, a specific process order may be performed differently from the described order. For example, two consecutively described processes may be performed substantially at the same time or performed in an order opposite to the described order.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-category (or first-set)," "second-category (or second-set)," etc., respectively.

When a first element is referred to as being "on," "connected to," or "coupled to" a second element, the first element may be directly on, connected to, or coupled to the second element or, one or more intervening elements may be present between the first element and the second element. When a first element is referred to as being "directly on," "directly connected to," or "directly coupled to" a second element, there are no intended intervening elements (except for environment elements such as air) present or connected between the first element and the second element.

The term "connect" may mean "directly connect" or "indirectly connect." The term "connect" may mean "mechanically connect" and/or "electrically connect." The term "connected" may mean "electrically connected" or "electrically connected through no intervening transistor." The term "insulate" may mean "electrically insulate" or "electrically isolate." The term "conductive" may mean "electrically conductive." The term "drive" may mean "operate" or "control." The term "include" may mean "be made of." The term "adjacent" may mean "immediately adjacent." The expression that an element extends in a particular direction may mean that the element extends lengthwise in the particular direction and/or that the lengthwise direction of the element is in the particular direction. The term "pattern" may mean "member." The expression that a space or opening overlaps an object may mean that (the position of) the space or opening overlaps with (the position of) the object. The term "first impurity ion" may mean "first-element (impurity) ion" or "first-material (impurity) ion"; the term "second impurity ion" may mean "second-element (impurity) ion" or "second-material (impurity) ion." The expression that each of a first member and a second member comprises a first impurity ion may mean that an impurity ion (e.g., a first first-element impurity ion) of the first member is identical to an impurity ion (e.g., a second first-element impurity ion) of the second member.

Spatially relative terms, such as "beneath," "below," "under," "lower," "above," "upper," "over," "higher," "side" (e.g., as in "sidewall"), and the like, may be used to describe structural relationships between elements illustrated in the drawings. Spatially relative terms may encompass different orientations of an apparatus in use, operation, storage, and/or manufacturing in addition to the orientations depicted in the drawings. For example, if the apparatus in the drawings is turned over, elements described as "below" or "beneath" other elements or features would then be oriented "above" the other elements or features. The apparatus may be otherwise oriented (e.g., rotated 90 degrees or at other orientations), and the spatially relative descriptors should be interpreted accordingly.

The singular forms, "a," "an," and "the" may include the plural forms as well, unless the context clearly indicates otherwise. The terms "comprises," "comprising," "includes," and/or "including," specify the presence of stated features, may do not preclude the presence or addition of one or more other features.

Variations from the illustrated shapes in the drawings as a result, for example, of manufacturing techniques and/or tolerances, are to be expected. The described embodiments should not necessarily be construed as limited to the particular illustrated shapes.

Figure 2:
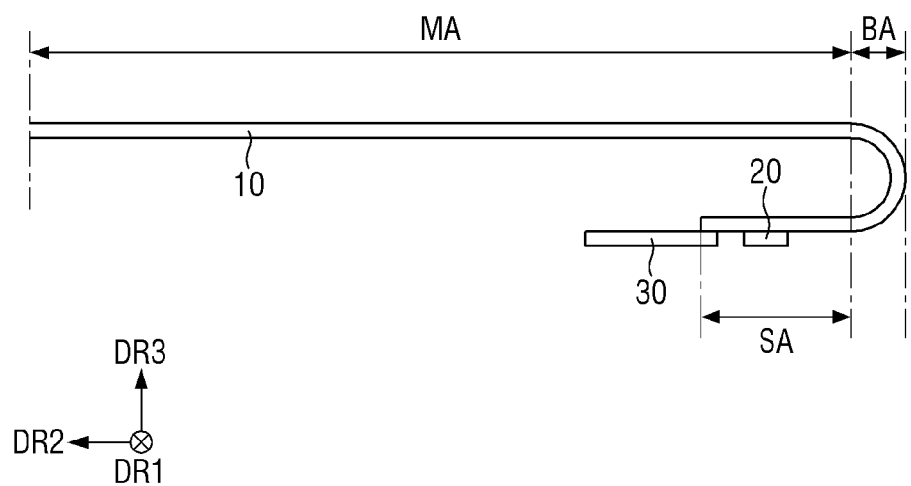
FIG. 2 is a side view illustrating a display device according to one embodiment.

FIG. 1 is a plan view illustrating a display device 1 according to one embodiment. FIG. 2 is a side view illustrating the display device 1 according to one embodiment. FIG. 2 illustrates the display device 1 bent in a thickness direction.

The display device 1 may display a moving image and/or a still image in response to input signals. The display device 1 may be used as a display screen of an electronic device, such as a television, a laptop computer, a monitor, a billboard, a device for Internet of things (IoT), a mobile phone, a smartphone, a tablet personal computer (PC), a smart watch, a watch phone, a mobile communication terminal, an electronic notebook, an electronic book, a portable multimedia player (PMP), a navigator, or an ultra-mobile PC (UMPC).

The display device 1 may have a rectangular shape with right-angled corners or rounded corners.

In the drawings, a first direction DR1 refers to a horizontal direction of in view of display area DA of the display device 1, and a second direction DR2 refers to a vertical direction in view of the display area DA of the display device 1 on the plan view. A third direction DR3 refers to a thickness direction of the display device 1. The first direction DR1, the second direction DR2, and the third direction DR3 may be perpendicular to each other.

Unless otherwise defined, in this specification, "upper" and "lower" are in the third direction DR3.

Referring to FIGS. 1 and 2, the display device 1 may include a display panel 10. The display panel 10 may include a flexible substrate that includes a flexible polymer material such as polyimide. The display panel 10 may be curved, bent, folded, or rolled.

The display panel 10 may be an organic light emitting display panel, a liquid crystal display panel, a quantum dot organic light emitting display panel, a quantum dot liquid crystal display, a quantum dot inorganic light emitting display panel, or a micro LED display panel.

The display panel 10 may include a display area DA for displaying images in response to input signals and may include a non-display area NDA not displaying images in response to input signals. The non-display area NDA may surround the display area DA. The non-display area NDA may constitute a bezel.

The display area DA may have a rectangular shape with right-angled corners or with rounded corners. The display area DA may have a circular shape, an oval shape, or one or more of other shapes.

The display area DA may include pixels arranged in a matrix/array. Each pixel may include a light emitting layer and a circuit layer for controlling the light emitting amount of the light emitting layer. The circuit layer may include a line, an electrode and at least one transistor. The light emitting layer may include an organic light emitting material. The light emitting layer may be encapsulated by an encapsulation film.

The non-display area NDA may surround all sides of the display area DA, and may constitute an edge of the display area DA.

The display panel 10 may include a main area MA and a bending area BA connected to one side of the main area MA in the second direction DR2. The display panel 10 may further include a sub-area SA connected with the bending area BA at one side of the second direction DR2. The bending area BA may be bent to make the sub-area SA overlap the main area MA in the thickness direction.

The display area DA may be positioned in the main area MA. The non-display area NDA may be positioned at a peripheral portion of the display area DA of the main area MA.

The main area MA may have a shape similar to an external shape on the plane of the display device 1. The main area MA may be flat. At least one of edge portions of the main area MA may be curved or bent.

If at least one of the edge portions of the main area MA is curved or bent, the display area DA may have at least one corresponding curved or bent edge portion, the non-display area NDA may occupy the curved or bent edge portion(s) of the main area MA, or the display area DA and the non-display area NDA may share the curved or bent edge portion(s) of the main area MA.

The non-display area NDA of the main area MA may span from an outer boundary of the display area DA to the edge of the display panel 10. Signal lines and/or driving circuits for applying signals to the display area DA may be disposed in the non-display area NDA of the main area MA.

The bending area BA may be connected to one short side of the main area MA. A width of the bending area BA (in the first direction DR1) may be narrower than a width of the main area MA (in the first direction DR1). A connection portion of the main area MA and the bending area BA may have an L-shaped structure to reduce a width of the bezel.

In the bending area BA, the display panel 10 may be bent with a radius of curvature in an opposite direction of a display surface.

The sub-area SA may extend from the bending area BA from a point where bending of the bending area BA is completed may extend parallel to the main area MA. The sub-area SA may overlap the main area MA in the thickness direction of the display panel 10. The sub-area SA may overlap the non-display area NDA at the edge of the main area MA, and may further overlap the display area DA of the main area MA. A width of the sub-area SA may be equal to a width of the bending area BA in the first direction DR1.

A pad portion may be disposed on the sub-area SA of the display panel 10. The pad portion may be connected to and/or attached to a driving chip 20, a driving substrate 30 (including a flexible printed circuit board and/or a rigid printed circuit board, a line connection film, and/or a connector.

The display panel 10 may include pad portions respectively connected to the driving chip 20 and the driving substrate 30. The driving chip 20 may be packaged on a film, and the film may be attached to the sub-area SA of the display panel 10.

The sub-area SA may be positioned between the driving chip 20 and the main area MA after the bending area BA has been bent. The driving chip 20 may be attached onto the display panel 10 through an anisotropic conductive film or through ultrasonic bonding. The driving chip 20 may include an integrated circuit for driving the display panel 10.

Figure 3:
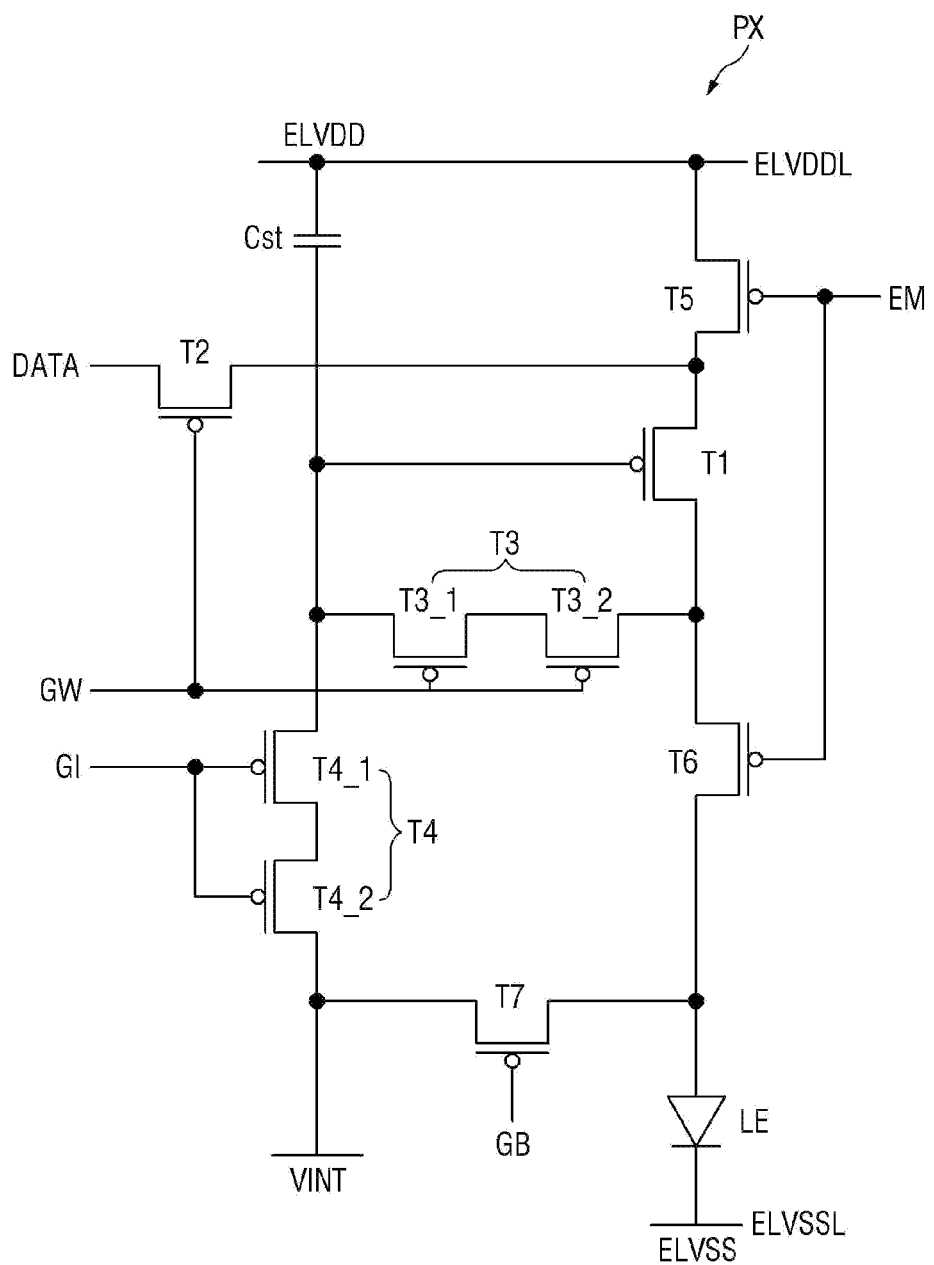
FIG. 3 is a circuit diagram illustrating one pixel according to one embodiment.

FIG. 3 is a circuit diagram illustrating one pixel according to one embodiment.

Referring to FIG. 3, a circuit of a pixel PX includes first to seventh transistors T1 to T7, a capacitor Cst, and a light emitting element LE. A data signal DATA, a first scan signal GW, a second scan signal GI, a third scan signal GB, a light emitting control signal EM, a first power voltage ELVDD, a second power voltage ELVSS and an initialization voltage VINT are applied to the circuit of the pixel PX.

Figure 6:
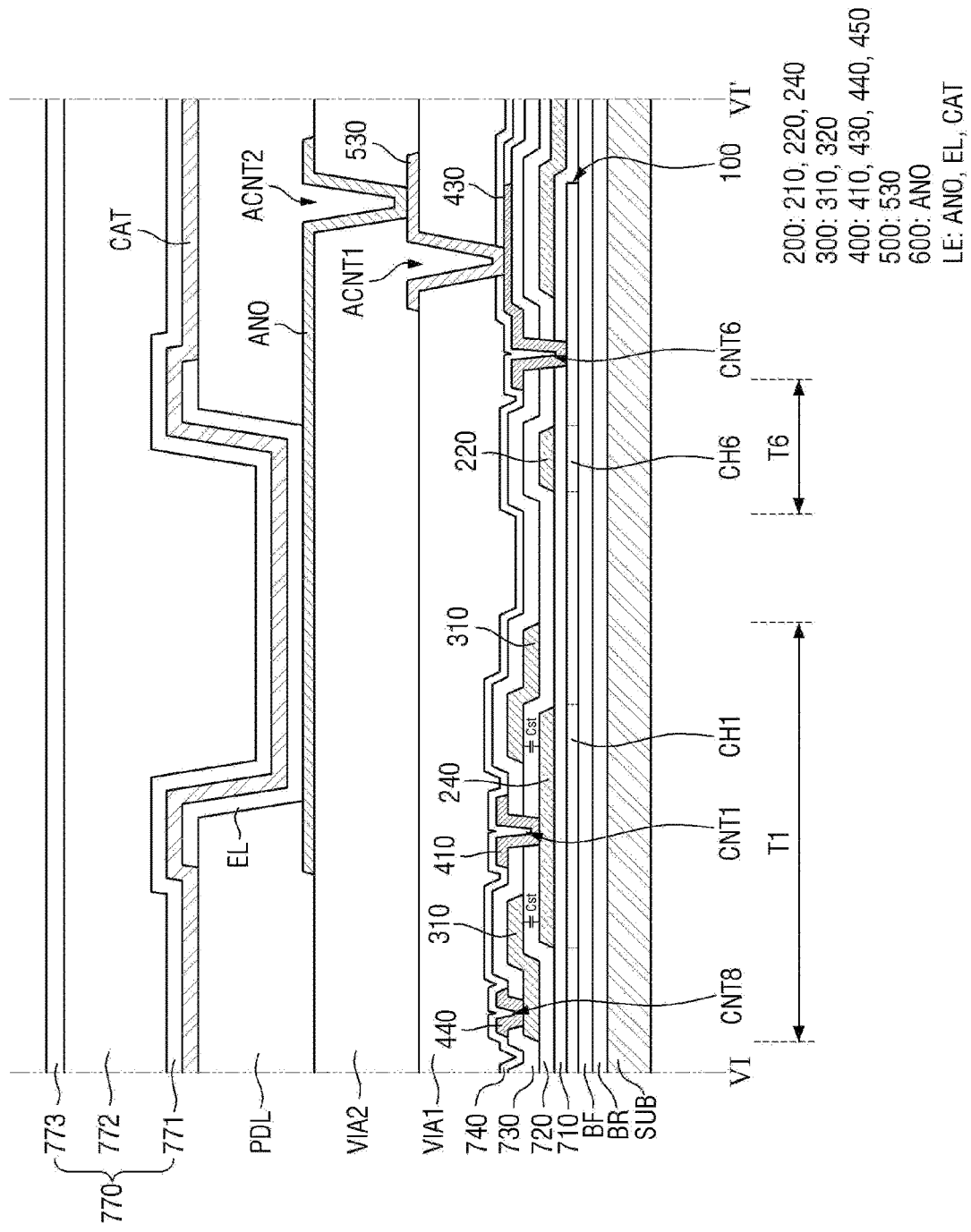
FIG. 6 is a cross-sectional view taken along line VI-VI' of FIG. 4 according to one embodiment.

The light emitting element LE may be an organic light emitting diode that includes a first electrode (or anode, see 'ANO' of FIG. 6), a light emitting layer (see 'EL' of FIG. 6), and a second electrode (or cathode, see 'CAT' of FIG. 6).

Each of the transistors T1 to T7 includes a channel, a gate electrode, a first electrode (or first source/drain electrode) and a second electrode (or second source/drain electrode). One of the first electrode and the second electrode of each of the transistors T1 to T7 is a source electrode, and the other one is a drain electrode.

Each of the transistors T1 to T7 may be a thin film transistor. The first transistor T1 may serve as a driving transistor, and the second to seventh transistors T2 to T7 may serve as switching transistors.

The channel of the first transistor T1 (a driving transistor) and the channels of the second to seventh transistors T2 to T7 (switching transistors) may be doped with the same material; the channel of the first transistor T1 may be doped with an additional material that is not doped in the channels of the second to seventh transistors T2 to T7. The doping configurations may produce desirable element characteristics of the driving transistor and the switching transistors.

Each of the transistors T1 to T7 may be one of a PMOS transistor and an NMOS transistor. The first transistor T1 (a driving transistor), the second transistor T2 (a data transfer transistor), the third transistor T3 (a compensation transistor), the fourth transistor T4 (a first initialization transistor), the fifth transistor T5 (a first light emitting control transistor), the sixth transistor T6 (a second light emitting control transistor), and the seventh transistor T7 (a second initialization transistor) may be all PMOS transistors.

The third transistor T3 (a compensation transistor) and the fourth transistor T4 (a first initialization transistor) may be NMOS transistors. The first transistor T1 (a driving transistor), the second transistor T2 (a data transfer transistor), the fifth transistor T5 (a first light emitting control transistor), the sixth transistor T6 (a second light emitting control transistor), and the seventh transistor T7 (a second initialization transistor) may be PMOS transistors.

Active layers of the third transistor T3 and the fourth transistor T4 may include a material different from that of active layers of the first transistor T1, the second transistor T2, the fifth transistor T5, the sixth transistor T6, and the seventh transistor T7. For example, each active layer of the third transistor T3 and the fourth transistor T4 may include an oxide semiconductor, and each active layer of the first transistor T1, the second transistor T2, the fifth transistor T5, the sixth transistor T6 and the seventh transistor T7 may include polycrystalline silicon.

The gate electrode of the first transistor T1 is connected to a first electrode of the capacitor Cst. The first electrode of the first transistor T1 is connected to a first power voltage line ELVDDL, which applies the first power voltage ELVDD, via the fifth transistor T5. The second electrode of the first transistor T1 is connected to the anode of the light emitting element LE via the sixth transistor T6. The first transistor T1 receives the data signal DATA in accordance with a switching operation of the second transistor T2 and supplies a driving current to the light emitting element LE.

The gate electrode of the second transistor T2 is connected to a first scan signal line, which applies the first scan signal GW1. A first electrode of the second transistor T2 is connected to a terminal of the data signal DATA. The second electrode of the second transistor T2 is connected to the first electrode of the first transistor T1 and is connected to the first power voltage line ELVDDL via the fifth transistor T5. The second transistor T2 is turned on in accordance with the first scan signal GW for transferring the data signal DATA to the first electrode of the first transistor T1.

The third transistor T3 may include a first sub-transistor T3_1 and a second sub-transistor T3_2. Regarding the first sub-transistor T31, its gate electrode is connected to the first scan signal line, its first electrode is connected to a second electrode of the second sub-transistor T32, and its second electrode is connected to each of the first electrode of the capacitor Cst, a first electrode of the third sub-transistor T4_1, and the gate electrode of the first transistor T1. Regarding the second sub-transistor T32, its gate electrode may be connected to the first scan signal line, its first electrode may be connected to the second electrode of the first transistor T1, and its second electrode may be connected to the first electrode of the first sub-transistor T3_1.

The first sub-transistor T3_1 and the second sub-transistor T3_2 are turned on by (two instances of) the first scan signal GW to connect the gate electrode of the first transistor T1 to the second electrode of the first transistor T1, to diode-connect the first transistor T1. Therefore, a voltage difference is generated between the first electrode of the first transistor T1 and the gate electrode of the first transistor T1 as much as a threshold voltage of the first transistor T1, and the data signal DATA adjusted with the threshold voltage may be supplied to the gate electrode of the first transistor T1 to compensate for the threshold voltage deviation of the first transistor T1.

The fourth transistor T4 may include a third sub-transistor T4_1 and a fourth sub-transistor T4_2. Regarding the third sub-transistor T4_1, its gate electrode may be connected to a second scan signal line (which is for applying the second scan signal GI); its first electrode may be connected to each of the first electrode of the capacitor Cst, the second electrode of the first sub-transistor T3_1, and the gate electrode of the first transistor T1; and its second electrode may be connected to a first electrode of the fourth sub-transistor T4_2. Regarding the fourth sub-transistor T4_2, its gate electrode may be connected to the second scan signal line; its first electrode may be connected to the second electrode of the third sub-transistor T4_1; and its second electrode may be connected to an initialization voltage line (which is for applying the initialization voltage VINT). The third sub-transistor T4_1 and the fourth sub-transistor T4_2 are turned on by (two instances of) the second scan signal GI to transfer the initialization voltage VINT to the gate electrode of the first transistor T1, for initializing a voltage of the gate electrode of the first transistor T1.

Regarding the fifth transistor T5, its gate electrode is connected to a light emitting control signal line (which is for applying the light emitting control signal EM), its first electrode is connected to the first power voltage line ELVDDL and its second electrode is connected to the first electrode of the first transistor T1. The fifth transistor T5 is turned on by the light emitting control signal EM to connect the first electrode of the first transistor T1 to the first power voltage line ELVDDL.

The sixth transistor T6 is connected between the second electrode of the first transistor T1 and the first electrode of the light emitting element LE. Regarding the sixth transistor T6, its gate electrode is connected to a light emitting control signal line; its first electrode is connected to each of the second electrode of the first transistor T1 and the first electrode of the second sub-transistor T3_2; and its second electrode is connected to the first electrode of the light emitting element LE.

The fifth transistor T5 and the sixth transistor T6 are simultaneously turned on in accordance with the light emitting control signal EM, for enabling a driving current to flow to the light emitting element LE.

A gate electrode of the seventh transistor T7 is connected to a third scan signal line, which is for applying the third scan signal GB. The first electrode of the seventh transistor T7 is connected to the anode of the light emitting element LE. The second electrode of the seventh transistor T7 is connected to the initialization voltage line. The seventh transistor T7 is turned on in accordance with the third scan signal GB to initialize the anode of the light emitting element LE.

In one or more embodiments, the circuit of the pixel PX may be configured such that the light emitting control signal EM or the second scan signal GI is applied to the gate electrode of the seventh transistor T7.

The capacitor Cst is formed between the gate electrode of the first transistor T1 and the first power voltage line ELVDDL, and includes a first electrode and a second electrode. The first electrode of the capacitor Cst may be connected to the gate electrode of the first transistor T1, the second electrode of the third transistor T3, and the first electrode of the fourth transistor T4. The second electrode of the capacitor Cst may be connected to the first power voltage line ELVDDL. The capacitor Cst may uniformly maintain the data voltage applied to the gate electrode of the first transistor T1.

The cathode of the light emitting element LE is connected to a second power voltage line ELVSSL, which is for applying a second power voltage ELVSS. The light emitting element LE emits light using the driving current transferred from the first transistor T1, for displaying a portion of an image.

Figure 4:
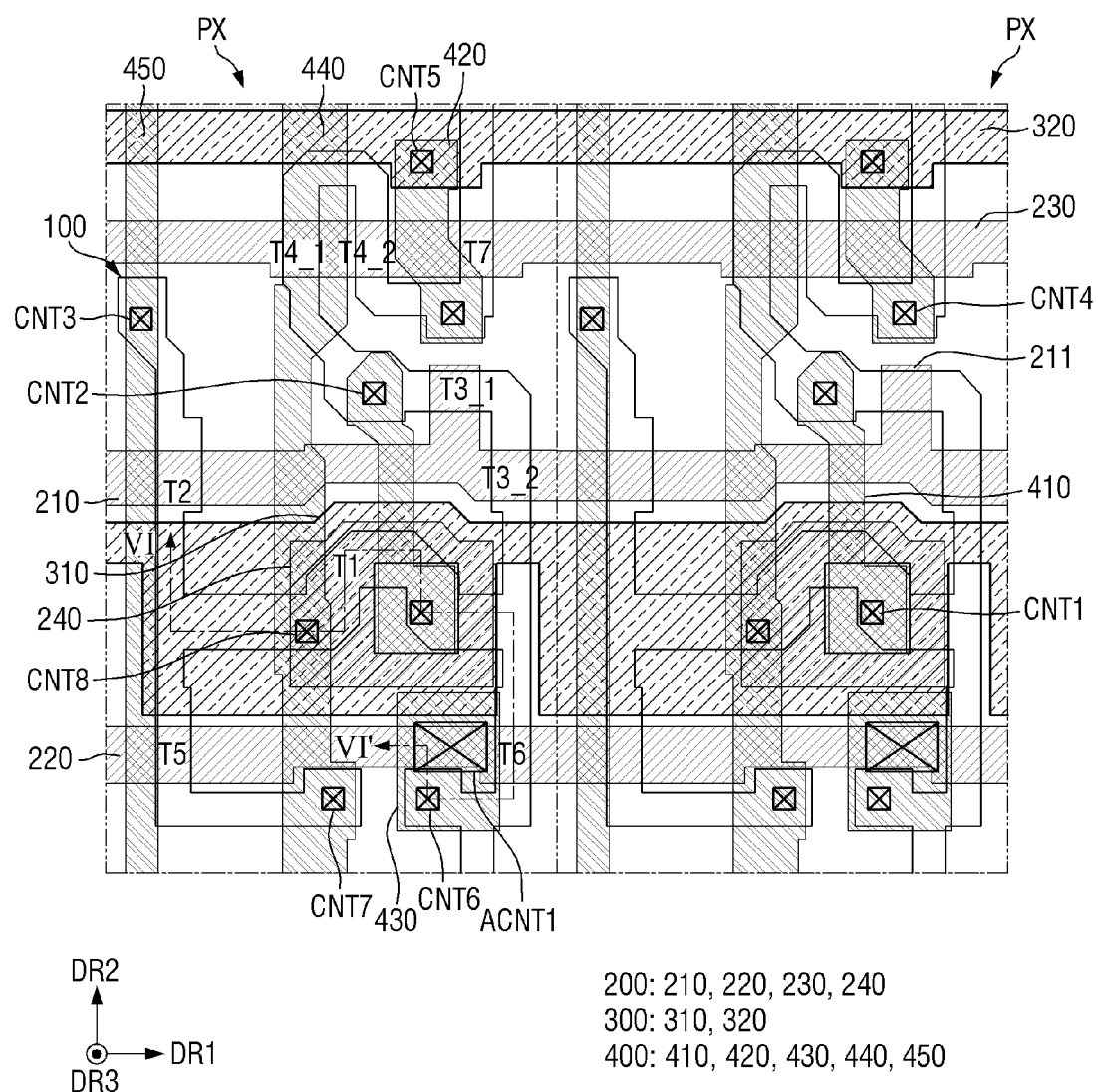
FIG. 4 is a layout view illustrating a pixel of a display device according to one embodiment.
Figure 5:
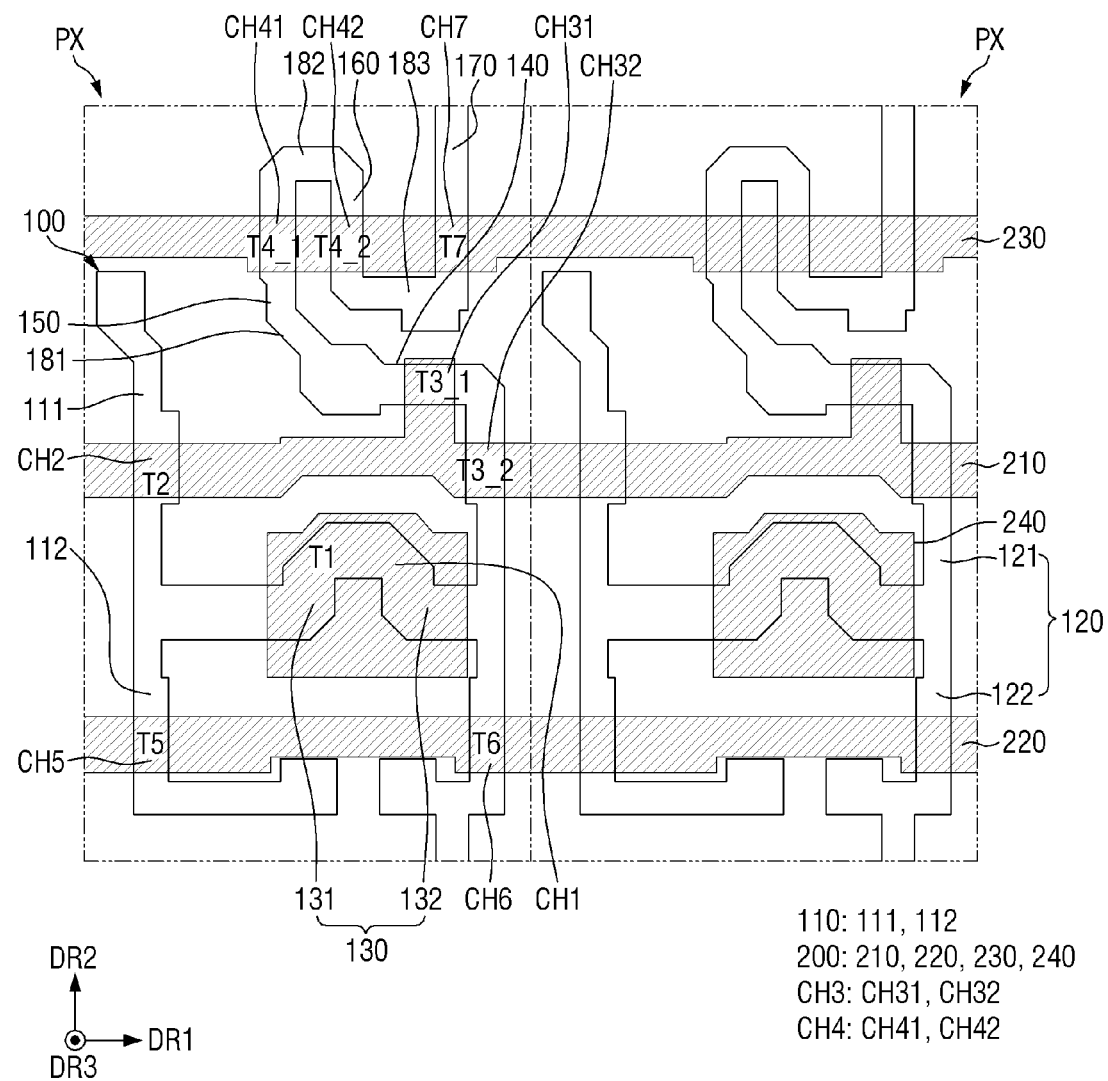
FIG. 5 is a layout view illustrating a semiconductor layer and a first conductive layer of a pixel according to one embodiment.

FIG. 4 is a layout view illustrating a pixel of a display device according to one embodiment. FIG. 5 is a layout view illustrating a semiconductor layer and a first conductive layer of the pixel according to one embodiment. FIG. 6 is a cross-sectional view taken along line VI-VI' of FIG. 4 according to one embodiment. FIG. 6 shows a fourth conductive layer 600 that includes an anode ANO, a light emitting layer EL, a cathode CAT, and a thin film encapsulation layer 770.

Referring to FIGS. 3, 4, 5, and 6, the pixel PX includes transistors T1 to T7, a capacitor Cst, and a light emitting element LE.

The capacitor Cst includes conductive layers (functioning as electrodes) and an insulating layer disposed between the conductive layers. The light emitting element LE includes conductive layers (functioning as an anode and a cathode) and an organic light emitting layer disposed between the conductive layers. Electrical connections between elements may be through a conductive line, a conductive layer, and/or a via made of a conductive material. The above-described elements are disposed on a substrate SUB.

Layers of the pixel PX may be disposed in the order of a substrate SUB, a barrier layer BR, a buffer layer BF, a semiconductor layer 100, a first insulating layer 710, a first conductive layer 200, a second insulating layer 720, a second conductive layer 300, a third insulating layer 730, a third conductive layer 400, a passivation layer 740, a first via layer VIA1, a fourth conductive layer 500, a second via layer VIA2, a fifth conductive layer 600, a pixel defining layer PDL, a light emitting layer EL, and a cathode CAT. Each of the layers may be a single layer or include a plurality of layers. One or more intervening layers may be disposed between some of the layers.

The substrate SUB supports the overlying layers. The substrate SUB may be a transparent substrate when the organic light emitting display device is a bottom emission type or a double-sided emission type. When the organic light emitting display device is a top emission type, the substrate SUB may include/be a translucent or opaque substrate and/or a transparent substrate.

The substrate SUB may be made of an insulating material, such as glass, quartz, or polymer resin. The polymer material may include one or more of polyethersulphone (PES), polyacrylate (PA), polyarylate (PAR), polyetherimide (PEI), polyethylene napthalate (PEN), polyethylene terephthalate (PET), polyphenylene sulfide (PPS), polyallylate, polyimide (PI), polycarbonate (PC), cellulose triacetate (CAT), and cellulose acetate propionate (CAP). The substrate SUB may include a metal material.

The substrate SUB may be a rigid substrate, or may be a flexible substrate that is bendable, foldable, and/or rollable. The flexible substrate may include polyimide (PI).

The barrier layer BR may be disposed on the substrate SUB. The barrier layer BR may cover an entire face of the substrate SUB. The barrier layer BR may prevent diffusion of impurity ions, may prevent permeation of moisture and/or external air, and may form a flat surface on the substrate SUB. The barrier layer BR may include silicon oxide ($SiO_x$), include silicon nitride ($SiN_x$), and/or silicon oxynitride ($SiO_xN_y$). The barrier layer BR may be optional.

The buffer layer BF may be disposed on the barrier layer BR. The buffer layer BF may cover an entire face of the barrier layer BR. The buffer layer BF may prevent diffusion of impurity ions, may prevent permeation of moisture and/or external air, and may form a flat surface on the barrier layer BR. The buffer layer BF may include silicon nitride, silicon oxide, and/or silicon oxynitride. The buffer layer BF may be optional.

The semiconductor layer 100 may be disposed on the buffer layer BF. The semiconductor layer 100 may include channels CH1, CH2, CH3, CH4, CH5, CH6 and CH7. The semiconductor layer 100 may include a source area and a drain area of each of the first to seventh transistors T1 to T7.

The semiconductor layer 100 may include interconnected portions in a pixel PX. The semiconductor layer 100 may include a first vertical portion 110, a second vertical portion 120, a third vertical portion 150, a fourth vertical portion 160 and a fifth vertical portion 170, which generally extend in the second direction DR2. The semiconductor layer 100 may include a first horizontal portion 130 and a second horizontal portion 140, which generally extend in the first direction DR1. The semiconductor layer 100 may include first to third connection portions 181, 182 and 183 electrically and mechanically connecting the vertical portions 110, 120, 150, 160, and 170 to the horizontal portions 130 and 140.

The first vertical portion 110 and the second vertical portion 120 may be spaced from each other. The first horizontal portion 130 may connect middle portions of the first vertical portion 110 and the second vertical portion 120 to each other. The middle portion of the first vertical portion 110 may be positioned between the portions 111 and 112 of the first vertical portion 110. The middle portion of the second vertical portion 120 may be positioned between the portions 121 and 122 of the second vertical portion 120. The first vertical portion 110, the second vertical portion 120, and the first horizontal portion 130 may form an H-shaped structure.

The first horizontal portion 130 may include a first bent portion 131 and a second bent portion 132.

The second horizontal portion 140 may extend from one end of the portion 121 of the second vertical portion 120, may be spaced from the first horizontal portion 130, and may mechanically and electrically connect the portion 120 toward the portions 150, 160, and 170.

The fourth vertical portion 160 may be disposed and connected between the third vertical portion 150 and the fifth vertical portion 170. The fifth vertical portion 170 may be connected to the portion 122 of the second vertical portion 120 of an adjacent pixel PX.

The first connection portion 181 may connect the second horizontal portion 140 to the third vertical portion 150, and may be inclined relative to the first direction DR1 and the second direction DR2.

The second connection portion 182 may connect the third vertical portion 150 to the fourth vertical portion 160.

The third connection portion 183 may connect the fourth vertical portion 160 to the fifth vertical portion 170.

The channels CH1 to CH7 of the transistors T1 to T7 may be portions of the semiconductor layer 100 that are overlapped by the first conductive layer 200. The channel CH3 of the third transistor T3 may include a first sub-channel CH31 (the channel of the first sub-transistor T31) and a second sub-channel CH32 (the channel of the second sub-transistor T32). The channel CH4 of the fourth transistor T4 may include a third sub-channel CH41 (the channel of the third sub-transistor T4_1) and a fourth sub-channel CH42 (the channel of the fourth sub-transistor T4_2).

The channel CH1 of the first transistor T1 may be disposed in the first horizontal portion 130 and may be overlapped by a gate electrode 240 of the first transistor T1. The channel CH2 of the second transistor T2 may be disposed in the portion 111 of the first vertical portion and may be overlapped by the first scan line 210. The channel CH31 of the first sub-transistor T3_1 may be disposed in the second horizontal portion 140 and may be overlapped by the first scan line 210. The channel CH32 of the second sub-transistor T32 may be disposed in the portion 121 of the second vertical portion and may be overlapped by the first scan line 210. The channel CH41 of the third sub-transistor T4_1 may be disposed in the third vertical portion 150 and may be overlapped by the second scan line 230. The channel CH42 of the fourth sub-transistor T4_2 may be disposed in the fourth vertical portion 160 and may be overlapped by the second scan line 230. The channel CH5 of the fifth transistor T5 may be disposed in the portion 112 of the first vertical portion and may be overlapped by the light emitting control line 220. The channel CH6 of the sixth transistor T6 may be disposed in the lower portion 122 of the second vertical portion and may be overlapped by the light emitting control line 220. The channel CH7 of the seventh transistor T7 may be disposed in the fifth vertical portion 170 and may be overlapped by the second scan line 230.

A channel of the driving transistor and a channel of the switching transistor may include different impurity ions. The channel of the driving transistor includes a first impurity ion and a second impurity ion, which are different from each other; the channel of the switching transistor may include only one of the first impurity ion and the second impurity ion. For example, the channel of the switching transistor may include the first impurity ion but may not include the second impurity ion. The channel of the driving transistor and the channel of the switching transistor may each include the first impurity ion, and the channel of the driving transistor may further include the second impurity ion.

The channel CH1 of the first transistor may include a first impurity ion containing a group-III element and may include a second impurity ion containing a group-V element. Each of the channels CH2, CH3, CH4, CH5, CH6 and CH7 of the second to seventh transistors T2, T3, T4, T5, T6 and T7 may include a first impurity ion containing a group-III element and may not include a second impurity ion containing a group-V element. Each of the channels CH1, CH2, CH3, CH4, CH5, CH6 and CH7 of the first to seventh transistors T1, T2, T3, T4, T5, T6 and T7 may include a first impurity ion containing a group-III element, and the channel CH1 of the first transistor T1 may further include a second impurity ion containing a group-V element. In an ion implantation process, the first impurity ion(s) and the second impurity ion(s) may be accelerated by an acceleration voltage and then irradiated toward the semiconductor layer 100, such that the first and second impurity ions may be doped on the channel area(s) of the corresponding transistor(s).

The group-III element may include boron (B), and the group-V element may include phosphorus (P). Each of the channels CH1, CH2, CH3, CH4, CH5, CH6 and CH7 of the first to seventh transistors T1, T2, T3, T4, T5, T6 and T7 may include boron (B), and the channel CH1 of the first transistor T1 may further include phosphorus (P).

When the channel CH1 of the first transistor T1, which is a driving transistor, includes boron (B) and phosphorus (P), unwanted hysteresis and instant afterimages may be mitigated.

Figure 7:
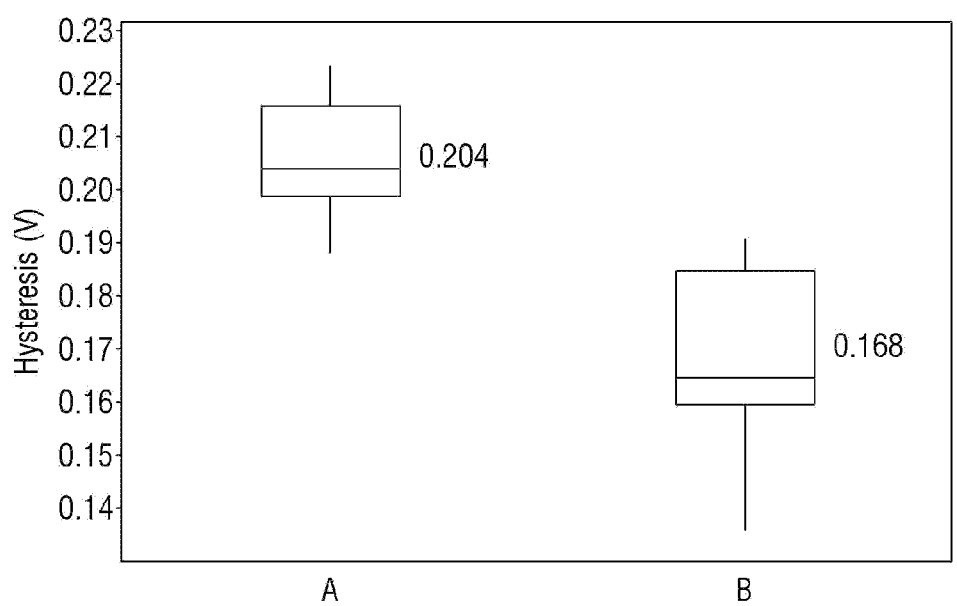
FIG. 7 is a graph illustrating hysteresis values based on impurity ions doped on a channel of a driving transistor according to one or more embodiments.

FIG. 7 is a graph illustrating hysteresis values based on impurity ions doped on a channel of a driving transistor according to one or more embodiments.

Referring to FIG. 7, the example 'A' represents hysteresis when the channel of the driving transistor includes is doped with only boron (B). The example 'B' represents hysteresis when the channel of the driving transistor is doped with both boron (B) and phosphorus (P).

Comparing 'A' with 'B', average hysteresis of 'A' is 0.204, and average hysteresis of 'B' is 0.168, significantly lower than that of the case of 'A'. As the channel area CH1 of the driving transistor T1 is doped with both boron (B) and phosphorus (P), the hysteresis issue may be mitigated.

Figure 8:
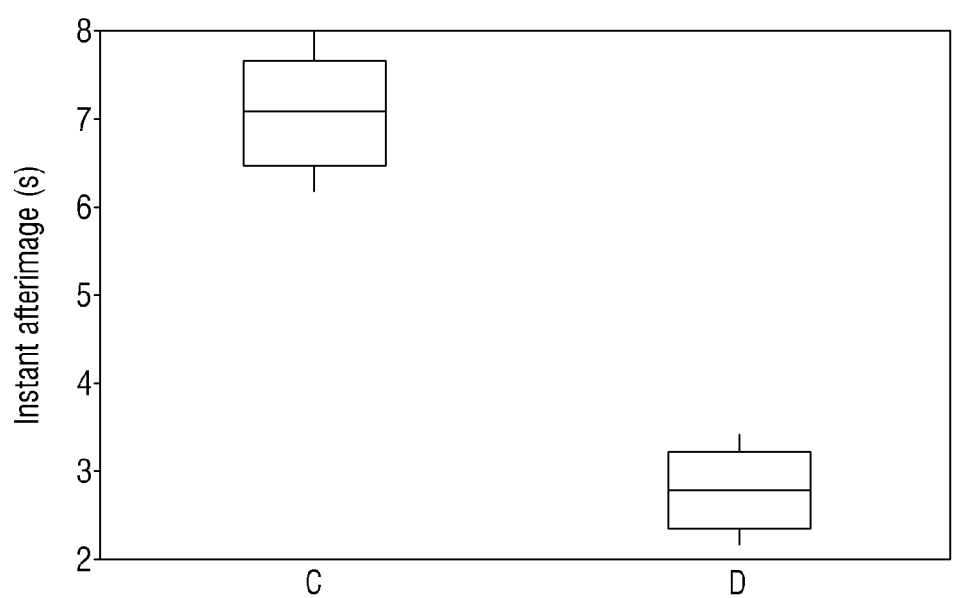
FIG. 8 is a graph illustrating durations of instant afterimages based on impurity ions doped on a channel of a driving transistor according to one or more embodiments.

FIG. 8 is a graph illustrating instant afterimage counts based on impurity ions doped on a channel of a driving transistor according to one or more embodiments.

Referring to FIG. 8, the example 'C' represents an instant afterimage duration when the channel of the driving transistor is doped with only boron (B). The example 'D' represents an instant afterimage duration when the channel of the driving transistor is doped with both boron (B) and phosphorus (P).

Comparing 'C' with 'D', an average instant afterimage duration of 'C' in is approximately 7 seconds (s), and an average instant afterimage duration of 'D' is 2.7 seconds (s), approximately, significantly shorter than that of the case of 'C'. As the channel area CH1 of the driving transistor T1 is doped with both boron (B) and phosphorus (P), the duration of an instant afterimage may be minimized.

The channel CH1 of the first transistor T1 includes both boron (B) and phosphorous (P). Therefore, the hysteresis issue of the first transistor T1 may be minimized. Advantageously, the duration of an unwanted instant afterimage of the display device may be minimized.

If the channel of the switching transistor is doped with both boron (B) and phosphorus (P), the element characteristics may be degraded because of an increase in the amount of doping. In embodiments, the channel of the switching transistor is doped by only one of boron (B) and phosphorus (P). Therefore, degradation of the element characteristics may be minimized or avoided.

Figure 9:
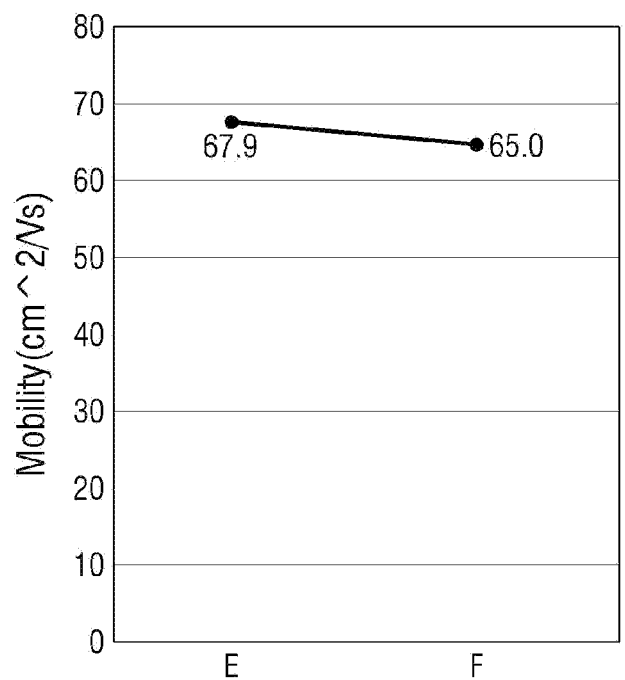
FIG. 9 is a graph illustrating carrier mobility values based on impurity ions doped on a channel of a switching transistor according to one or more embodiments.

FIG. 9 is a graph illustrating carrier mobility values based on impurity ions doped on a channel of a switching transistor according to one or more embodiments.

Referring to FIG. 9, the example 'E' represents carrier mobility when the channel of the switching transistor is doped with only boron (B). The example 'F' represents carrier mobility when the channel of the switching transistor is doped with both boron (B) and phosphorus (P).

Comparing 'E' with 'F', an average carrier mobility value of 'E' is 67.9 cm^2/Vs, approximately, and an average carrier mobility value of 'F' is 65.0 cm^2/Vs, approximately, significantly lower than that of the case of 'E'. As the channel area of the switching transistor is doped with only boron (B) and does not include phosphorus (P), deterioration of carrier mobility may be minimized or avoided.

Figure 10:
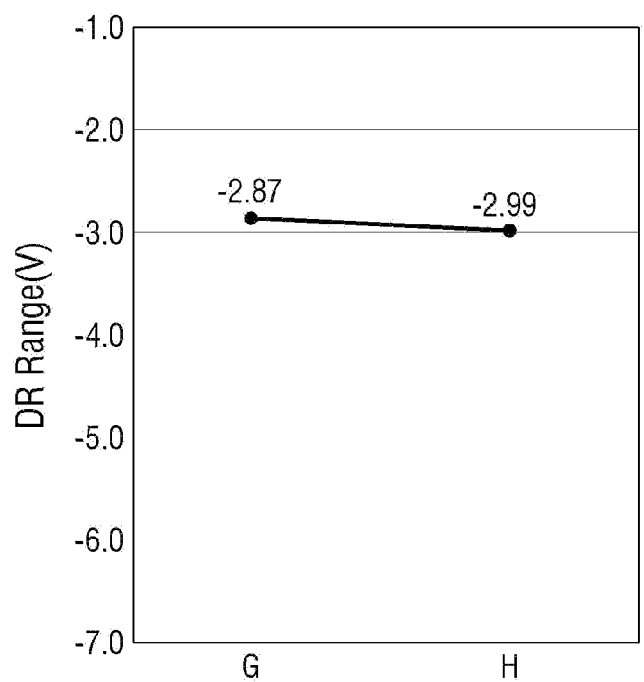
FIG. 10 is a graph illustrating a driving voltage (DR) range values based on impurity ions doped on a channel of a switching transistor according to one or more embodiments.

FIG. 10 is a graph illustrating a driving voltage (DR) range values based on impurity ions doped on a channel of a switching transistor according to one or more embodiments.

Referring to FIG. 10, the example 'G' represents a driving voltage range when the channel of the switching transistor is doped with only boron (B). The example 'G' represents a driving voltage range when the channel of the switching transistor is doped with both boron (B) and phosphorus (P).

Comparing 'G' with 'H', an average driving voltage range of 'G' is −2.87 V, approximately, and an average driving voltage range of 'H' is −2.99 V, approximately, significantly greater than that of the case of 'G'. As the channel area of the switching transistor is doped with boron (B) and does not include phosphorus (P), unwanted increase in the driving voltage range may be minimized or avoided.

Each of the channels CH2, CH3, CH4, CH5, CH6 and CH7 of the second to seventh transistors T2, T3, T4, T5, T6 and T7 is doped with only boron (B) and does not include phosphorous (P). Therefore, unwanted decrease in carrier mobility of the switching transistor and unwanted increase in the driving voltage range may be minimized or avoided. Advantageously, unwanted degradation of switching characteristics of the switching transistors and unwanted deterioration of a driving speed based on one or more of the switching transistors may be minimized or avoided.

The channel CH1 of the first transistor T1 includes both boron (B) and phosphorus (P), and each of the channels CH2, CH3, CH4, CH5, CH6 and CH7 of the second to seventh transistors T2, T3, T4, T5, T6 and T7 includes boron (B) but not phosphorus (P). Therefore, the hysteresis and instant afterimage issues may be mitigated, and the switching characteristics of the switching transistors may be satisfactory.

Referring back to FIGS. 4 to 6, the semiconductor layer 100 may include polycrystalline silicon. The polycrystalline silicon may be formed by crystallizing amorphous silicon. Examples of the crystallization method include rapid thermal annealing (RTA), solid phase crystallization (SPC), excimer laser annealing (ELA), metal induced crystallization (MIC), metal induced lateral crystallization (MILC), and sequential lateral solidification (SLS). The semiconductor layer 100 may include single crystal silicon, low temperature polycrystalline silicon, amorphous silicon, or the like. The semiconductor layer 100 may include an oxide semiconductor.

The first insulating layer 710 may be disposed on the semiconductor layer 100, and may substantially cover an entire face of the substrate SUB. The first insulating layer 710 may be a gate insulating layer for insulating gate electrodes from the semiconductor layer 100.

The first insulating layer 710 may include a silicon compound and/or a metal oxide. For example, the first insulating layer 710 may include at least one of silicon oxide, silicon nitride, silicon oxynitride, aluminum oxide, tantalum oxide, hafnium oxide, zirconium oxide, and titanium oxide.

The first conductive layer 200 is disposed on the first insulating layer 710. The first conductive layer 200 may include a first scan line 210 for transferring a first scan signal ('GW' of FIG. 3), a gate electrode 240 of the first transistor T1, a light emitting control line 220 for transferring a light emitting control signal ("EM" of FIG. 3), and a second scan line 230 for supplying a second scan signal ('GI' of FIG. 3).

The first scan line 210 may include gate electrodes of the second transistor T2, the first sub-transistor T3_1, and the second sub-transistor T3_2. The light emitting control line 220 may include a gate electrode of the fifth transistor T5 and a gate electrode of the sixth transistor T6. The second scan line 230 may include gate electrodes of the third sub-transistor T4_1, the fourth sub-transistor T4_2 and the seventh transistor T7.

Each of the first scan line 210, the light emitting control line 220, and the second scan line 230 may extend in the first direction DR1 across multiple pixels PX arranged in the first direction DR1.

The first scan line 210 may be positioned between the lines 220 and 230, and may overlap each of the portion 111 of the first vertical portion and the portion 121 of the second vertical portion of the semiconductor layer 100.

The first scan line 210 may include the gate electrode of the second transistor T2 in an area overlapping the portion 111 of the first vertical portion of the semiconductor layer 100. A portion of the first vertical portion 110 of the semiconductor layer 100 positioned at one side of the gate electrode of the second transistor T2 may be a first area of the second transistor T2. A portion of the first vertical portion 110 of the semiconductor layer 100 positioned at the other side of the gate electrode of the second transistor T2 may be a second area of the second transistor T2.

The first scan line 210 may include the gate electrode of the second sub-transistor T3_2 in an area overlapping the portion 121 of the second vertical portion 120 of the semiconductor layer 100. A portion of the second vertical portion 120 of the semiconductor layer 100 positioned at one side of the gate electrode of the second sub-transistor T32 may be a second area of the second sub transistor T3_2. A portion of the second vertical portion 120 of the semiconductor layer 100 positioned at the other side of the gate electrode of the second sub-transistor T3_2 may be a first area of the second-sub transistor T3_2.

The first scan line 210 may include a first scan line protrusion 211. The first scan line protrusion 211 may be protruded from the first scan line 210 in the second direction DR2.

The first scan line protrusion 211 overlaps the second horizontal portion 140 of the semiconductor layer 100, and may include the gate electrode of the first sub-transistor T3_1 in the overlap area. A portion of the second horizontal portion 140 of the semiconductor layer 100 positioned at one side of the gate electrode of the first sub-transistor T31 may be a first area of the first sub-transistor T31. A portion of the second horizontal portion 140 of the semiconductor layer 100 positioned at the other side of the gate electrode of the first sub-transistor T31 may be a second area of the first sub-transistor T3_1.

The light emitting control line 220 may overlap each of the portion 112 of the first vertical portion and the portion 122 of the second vertical portion of the semiconductor layer 100.

The light emitting control line 220 may include the gate electrode of the fifth transistor T5 in an area overlapping with the portion 112 of the first vertical portion of the semiconductor layer 100. A portion of the first vertical portion 110 of the semiconductor layer 100 positioned at one side of the gate electrode of the fifth transistor T5 may be a second area of the fifth transistor T5. A portion of the first vertical portion 110 of the semiconductor layer 100 positioned at the other side of the gate electrode of the fifth transistor T5 may be a first area of the fifth transistor T5.

The light emitting control line 220 may include the gate electrode of the sixth transistor T6 in an area overlapping the portion 121 of the second vertical portion. A portion of the second vertical portion 120 of the semiconductor layer 100 positioned at one side of the gate electrode of the sixth transistor T6 may be a first area of the sixth transistor T6. A portion of the second vertical portion 120 of the semiconductor layer 100 positioned at the other side of the gate electrode of the sixth transistor T6 may be a second area of the sixth transistor T6.

The second scan line 230 may overlap the third vertical portion 150, the fourth vertical portion 160, and the fifth vertical portion 170 of the semiconductor layer 100.

The second scan line 230 may include the gate electrode of the third sub-transistor T4_1 in an area overlapping the third vertical portion 150 of the semiconductor layer 100. A portion of the third vertical portion 150 of the semiconductor layer 100 positioned at one side of the gate electrode of the third sub-transistor T4_1 may be a second area of the third sub transistor T4_1. A portion of the third vertical portion 150 of the semiconductor layer 100 positioned at the other side of the gate electrode of the third sub-transistor T4_1 may be a first area of the third sub transistor T4_1.

The second scan line 230 may include the gate electrode of the fourth sub-transistor T4_2 in an area overlapping the fourth vertical portion 160 of the semiconductor layer 100. A portion of the fourth vertical portion 160 of the semiconductor layer 100 positioned at one side of the gate electrode of the fourth sub-transistor T4_2 may be a first area of the fourth sub transistor T4_2. A portion of the fourth vertical portion 160 of the semiconductor layer 100 positioned at the other side of the gate electrode of the fourth sub-transistor T4_2 may be a second area of the fourth sub transistor T4_2.

The second scan line 230 may include the gate electrode of the seventh transistor T7 in an area overlapping the fifth vertical portion 170 of the semiconductor layer 100. A portion of the fifth vertical portion 170 of the semiconductor layer 100 positioned at one side of the gate electrode of the seventh transistor T7 may be a second area of the seventh transistor T7. A portion of the fifth vertical portion 170 of the semiconductor layer 100 positioned at the other side of the gate electrode of the seventh transistor T7 may be a first area of the seventh transistor T7.

The gate electrode of each of the second to seventh transistors T2 to T7 may be wider than a non-gate line section of the corresponding conductive line.

The gate electrode 240 of the first transistor T1 may be positioned near the center of the pixel PX. The gate electrode 240 of the first transistor T1 may be positioned between the first scan line 210 and the emitting control line 220 in the plan view of the pixel PX. The gate electrodes 240 of the first transistors T1 of different pixels PX may be separated from each other.

The gate electrode 240 of the first transistor T1 overlaps the first horizontal portion 130 of the semiconductor layer 100. A portion of the first horizontal portion 130 of the semiconductor layer 100 positioned at the other side of the gate electrode 240 of the first transistor T1 may be a first area of the first transistor T1. A portion of the first horizontal portion 130 of the semiconductor layer 100 positioned at one side of the gate electrode 240 of the first transistor T1 may be a second area of the first transistor T1.

The first conductive layer 200 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The second insulating layer 720 serves to insulate the first conductive layer 200 from the second conductive layer 300. The second insulating layer 720 may be disposed on the first conductive layer 200, and may substantially cover an entire face of the substrate SUB. The second insulating layer 720 may be an interlayer insulating layer.

The second insulating layer 720 may include an inorganic insulating material, such as silicon oxide, silicon nitride, silicon oxynitride, hafnium oxide, aluminum oxide, titanium oxide, tantalum oxide, and/or zinc oxide, and/or an organic insulating material such as a polyacrylates resin, an epoxy resin, a phenolic resin, a polyamides resin, a polyimides resin, an unsaturated polyesters resin, a poly phenylenethers resin, a polyphenylenesulfides resin, and/or benzocyclobutene (BCB). The second insulating layer 720 may be a single layer or a multi-layered film made of deposited layers of different materials.

The second conductive layer 300 is disposed on the second insulating layer 720. The second conductive layer 300 may include a capacitor electrode line 310, and may include an initialization voltage line 320 for supplying an initialization voltage ('VINT' of FIG. 3).

Each of the capacitor electrode line 310 and the initialization voltage line 320 may extend in the first direction DR1 across multiple pixels PX arranged in the first direction DR1.

The capacitor electrode line 310 crosses a central portion of the pixel PX, and may overlap the underlying gate electrode 240 of the first transistor T1 with the second insulating layer 720 being interposed between the elements 310 and 240. The gate electrode 240 of the first transistor T1 may be a first electrode of the capacitor Cst. An area of the capacitor electrode line 310 overlapping the first electrode of the capacitor Cst may be a second electrode of the capacitor Cst. The portion of the second insulating layer 720 interposed between the first electrode and the second electrode may be a dielectric of the capacitor Cst.

In an area overlapping the gate electrode 240 of the first transistor T1, a width of the capacitor electrode line 310 may be enlarged. The capacitor electrode line 310 may include an opening that overlaps with (and exposes) the underlying gate electrode 240 of the first transistor T1.

The initialization voltage line 320 may be positioned along one side of the pixel PX. The initialization voltage line 320 may overlap the fifth vertical portion 170 of the semiconductor layer 100.

The second conductive layer 300 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The third insulating layer 730 covers the second conductive layer 300. The third insulating layer 730 may substantially cover an entire face of the substrate SUB. The third insulating layer 730 may be an interlayer insulating layer. The third insulating layer 730 may include one or more materials identical to one or more materials of the second insulating layer 720.

The third conductive layer 400 is disposed on the third insulating layer 730. The third conductive layer 400 may include data patterns 410 and 420, a first anode connection electrode 430 electrically connected between an anode ANO of the light emitting element LE (see FIG. 6) and the semiconductor layer 100, a first power voltage line 440 for supplying a first power voltage ('ELVDD' of FIG. 3), and a data line 450 for transferring a data signal ('DATA' of FIG. 3).

The third conductive layer 400 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 400 may be a single layer or a multi-layered film. For example, the third conductive layer 400 may be/include a stacked structure of Ti—Al—Ti, Mo—Al—Mo, Mo—AlGe—Mo, and/or Ti—Cu.

Each of the data patterns 410 and 420 may extend generally in the second direction DR2 and may be shorter than the pixel PX in the second direction DR2. The data patterns 410 and 420 are physically spaced apart from each other. The data patterns 410 and 420 may electrically connect members that are spaced apart from each other.

The first data pattern 410 may overlap the gate electrode 240 of the first transistor T1. The first data pattern 410 may be electrically connected to the gate electrode 240 of the first transistor T1 through a first contact hole CNT1 that exposes the gate electrode 240 of the first transistor T1 through the third insulating layer 730 and the second insulating layer 720. The first contact hole CNT1 may be positioned in an opening of the capacitor electrode line 310. The portion of the first data pattern 410 in the first contact hole CNT1 may be insulated from the capacitor electrode line 310 by the third insulating layer 730.

The first data pattern 410 may cross the first scan line 210, may be insulated from the first scan line 210, and may overlap a portion of the second horizontal portion 140 of the semiconductor layer 100. The first data pattern 410 may be electrically connected to the second horizontal portion 140 of the semiconductor layer 100 through a second contact hole CNT2 that exposes a portion of the second horizontal portion 140 of the semiconductor layer 100 through the third insulating layer 730, the second insulating layer 720, and the first insulating layer 710. The portion of the second horizontal portion 140 may be the second area of the first sub-transistor T3_1.

The first data pattern 410 may electrically connect the gate electrode 240 of the first transistor T1 to the second horizontal portion 140 of the semiconductor layer 100.

The second data pattern 420 may overlap the third connection portion 183 of the semiconductor layer 100. The second data pattern 420 may be electrically connected to the third connection portion 183 of the semiconductor layer 100 through a fourth contact hole CNT4 that exposes the third connection portion 183 of the semiconductor layer 100 through the third insulating layer 730, the second insulating layer 720, and the first insulating layer 710.

The second data pattern 420 may cross the second scan line 230, may be insulated from the second scan line 230, and may overlap the initialization voltage line 320. The second data pattern 420 may be electrically connected to the initialization voltage line 320 through a fifth contact hole CNT5 that exposes the initialization voltage line 320 through the third insulating layer 730.

The second data pattern 420 may electrically connect the third connection portion 183 of the semiconductor layer 100 to the initialization voltage line 320.

The first anode connection electrode 430 may extend generally in the second direction DR2 and may be shorter than the pixel PX in the second direction DR2. The first anode connection electrode 430 is physically spaced apart from the plurality of data patterns 410 and 420. The first anode connection electrode 430 may connect the semiconductor layer 100 to the anode ANO together with a second anode connection electrode 530.

The first anode connection electrode 430 may overlap the portion 122 of the second vertical portion of the semiconductor layer 100. The first anode connection electrode 430 may be electrically connected to the lower portion 122 of the second vertical portion of the semiconductor layer 100 through a sixth contact hole CNT6 that exposes the lower portion 122 of the second vertical portion of the semiconductor layer 100 through the third insulating layer 730, the second insulating layer 720, and the first insulating layer 710.

The first power voltage line 440 may extend in the second direction DR2 across multiple pixels PX arranged in the second direction DR2. The first power voltage line 440 may be electrically connected to the capacitor electrode line 310 through an eighth contact hole CNT8 that exposes the capacitor electrode line 310 through the third insulating layer 730.

The first power voltage line 440 may be electrically connected to the portion 112 of the first vertical portion of the semiconductor layer 100 through a seventh contact hole CNT7 that exposes the lower portion 112 of the first vertical portion of the semiconductor layer 100 through the third insulating layer 730, the second insulating layer 720, and the first insulating layer 710.

The data line 450 may extend in the second direction DR2 across multiple pixels PX arranged in the second direction DR2. The data line 450 may be adjacent to an edge of the pixel PX. The data line 450 may overlap the first vertical portion 110 of the semiconductor layer 100.

The data line 450 may be electrically connected to the portion 111 of the first vertical portion of the semiconductor layer 100 through a third contact hole CNT3 that exposes the upper portion 111 of the first vertical portion of the semiconductor layer 100 through the third insulating layer 730, the second insulating layer 720, and the first insulating layer 710. The third contact hole CNT3 may be positioned between the second scan line 230 and the first scan line 210 in the plan view of the pixel PX.

The passivation layer 740 may be formed on the third conductive layer 400. The passivation layer 740 may be an inorganic layer, for example, a silicon nitride layer, a silicon oxynitride layer, a silicon oxide layer, a titanium oxide layer, or an aluminum oxide layer. The passivation layer 740 may be optional.

A first via layer VIA1 is disposed on the passivation layer 740. The first via layer VIA1 may be a planarization layer. The first via layer VIA1 may include an inorganic insulating material, and/or an organic insulating material such as a polyacrylates resin, an epoxy resin, a phenolic resin, a polyamides resin, a polyimides resin, an unsaturated polyesters resin, a poly phenylenethers resin, a polyphenylenesulfides resin, and/or benzocyclobutene (BCB).

The fourth conductive layer 500 is disposed on the first via layer VIA1. The fourth conductive layer 500 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

The fourth conductive layer 500 may include a second anode connection electrode 530. A first anode contact hole ACNT1 may be disposed in the first via layer VIA1 to expose the first anode connection electrode 430 through the first via layer VIA1 and the passivation layer 740. The second anode connection electrode 530 may be connected to the first anode connection electrode 430 through the first anode contact hole ACNT1.

A second via layer VIA2 is disposed on the fourth conductive layer 500. The second via layer VIA2 may be a planarization layer. The second via layer VIA2 may include an inorganic insulating material, and/or an organic insulating material such as a polyacrylates resin, an epoxy resin, a phenolic resin, a polyamides resin, a polyimides resin, an unsaturated polyesters resin, a poly phenylenethers resin, a polyphenylenesulfides resin and/or benzocyclobutene (BCB).

The fifth conductive layer 600 is disposed on the second via layer VIA2. The fifth conductive layer 600 may include an anode ANO. The anodes ANO of different pixels PX may be separated and insulated from each other. The anode ANO may be electrically connected to the second anode connection electrode 530 through a second anode contact hole ACNT2 that exposes the second anode connection electrode 530 through the second via layer VIA2.

The anode ANO may have a stacked structure that includes a material layer formed of one or more materials having a high work function, such as Indium-Tin-Oxide (ITO), Indium-Zinc-Oxide (IZO), Zinc Oxide (ZnO) and/or Indium Oxide ($In_2O_3$), and includes a reflective material layer formed of silver (Ag), magnesium (Mg), aluminum (Al), platinum (Pt), lead (Pb), gold (Au), nickel (Ni), neodymium (Nd), iridium (Ir), chromium (Cr), lithium (Li), and/or calcium (Ca). The material layer having a high work function may be disposed closer to the light emitting layer EML than the reflective material layer. The anode ANO may have a multi-layered structure of ITO-Mg, ITO-MgF, ITO-Ag, and/or ITO-Ag-ITO.

The pixel defining layer PDL may be disposed on the fifth conductive layer 600. The pixel defining layer PDL may include an opening that partially exposes the anode ANO. The pixel defining layer PDL may be made of an organic insulating material and/or an inorganic insulating material. For example, the pixel defining layer PDL may include at least one of a polyimides resin, an acrylic resin, a silicon compound, or a polyacrylic resin.

The light emitting layer EL is disposed on the portion of the anode ANO exposed by the pixel defining layer PDL. The light emitting layer EL may include an organic material layer. The organic material layer may include an organic light emitting layer, and may further include one or more hole injection/transport layers and/or one or more electron injection/transport layers.

The cathode CAT may be disposed on the light emitting layer EL. The cathode CAT may be a common electrode shared by multiple pixels PX. The anode ANO, the light emitting layer EL and the cathode CAT may constitute the light emitting element LE.

The cathode CAT may include one or more materials having a low work function, such as Li, Ca, LiF—Ca, LiF—Al, Al, Mg, Ag, Pt, Pd, Ni, Au Nd, Ir, Cr, BaF, and/or Ba, e.g., a mixture of Ag and Mg. The cathode CAT may further include a transparent metal oxide layer disposed on the material layer having a low work function.

The thin film encapsulation layer 770 includes a first inorganic encapsulation layer 771, a first organic encapsulation layer 772, and a second inorganic encapsulation layer 773 and is disposed on the cathode CAT. At the end of the thin film encapsulation layer 770, the first inorganic encapsulation layer 771 and the second inorganic encapsulation layer 773 may directly contact each other. The first organic encapsulation layer 772 may be encapsulated by the first inorganic encapsulation layer 771 and the second inorganic encapsulation layer 773.

Each of the first inorganic encapsulation layer 771 and the second inorganic encapsulation layer 773 may include silicon nitride, silicon oxide, and/or silicon oxynitride. The first organic encapsulation layer 772 may include an organic insulating material.

Figure 11:
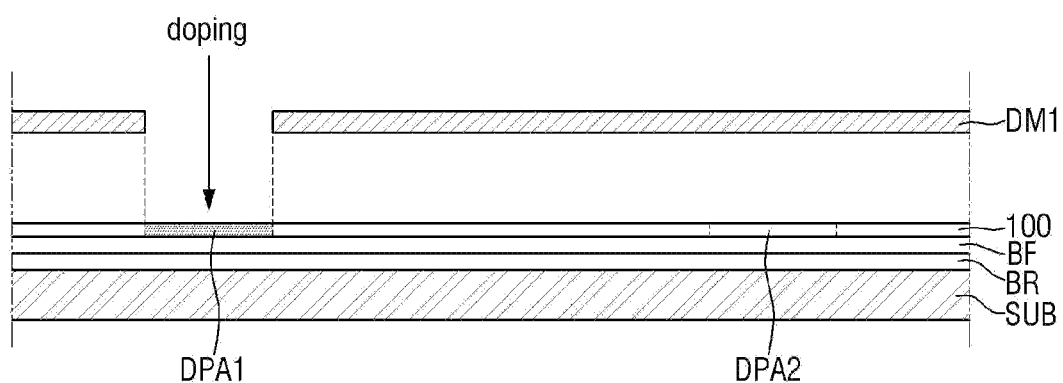
FIG. 11 and FIG. 12 are cross-sectional views illustrating structures formed in a method of manufacturing a display device according to one embodiment.
Figure 12:
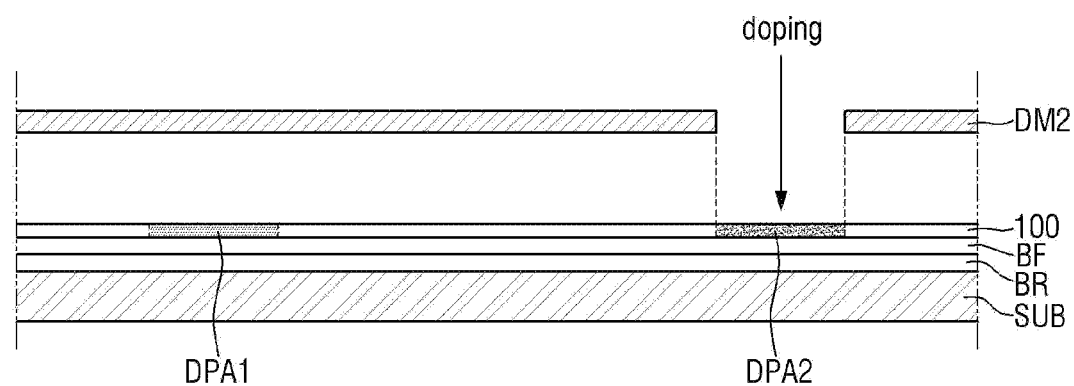

FIGS. 11 and 12 are cross-sectional views illustrating structures formed in a method of manufacturing a display device according to one embodiment.

Referring to FIG. 11, first impurity ions (or first-element impurity ions) and second impurity ions (or second-element impurity ions) are doped on (and into) a first doping area DPA1 of the semiconductor layer 100 through a first doping mask DM1.

A substrate SUB is prepared. A barrier layer BR is disposed on the substrate SUB. A buffer layer BF is disposed on the barrier layer BR. A semiconductor layer 100 is disposed on the buffer layer BF. The semiconductor layer 100 may include a first doping area DPA1 and a second doping area DPA2. The first doping area DPA1 may correspond to the channel of the driving transistor, and the second doping area DPA2 may correspond to the channel of a switching transistor.

The first doping mask DM1 is disposed on/over the semiconductor layer 100. The first doping mask DM1 may expose the first doping area DPA1, and may cover the second doping area DPA2. Using the first doping mask DM1, the first impurity ions and the second impurity ions (different from the first impurity ions) are doped on the first doping area DPA1. The first impurity ions may include a group-III element, and the second impurity ions may include a group-V element. The group-III element may include boron (B), and the group-V element may include phosphorus (P). The first doping area DPA1 may include both boron (B) and phosphorus (P) after being doped with boron (B) ions and phosphorus (P) ions.

Subsequently, referring to FIG. 12, through a second doping mask DM2, the first impurity ions or the second impurity ions are doped on (and into) the second doping area DPA2 of the semiconductor layer 100.

The second doping mask DM2 is disposed on/over the semiconductor layer 100. The second doping mask DM2 may expose the second doping area DPA2, and may cover the first doping area DPA1. Using the second doping mask DM2, only one of the first impurity ions and the second impurity ions are doped on the second doping area DPA2. For example, the second doping area DPA2 may include phosphorus (P) after being doped with phosphorus (P) ions.

Figure 13:
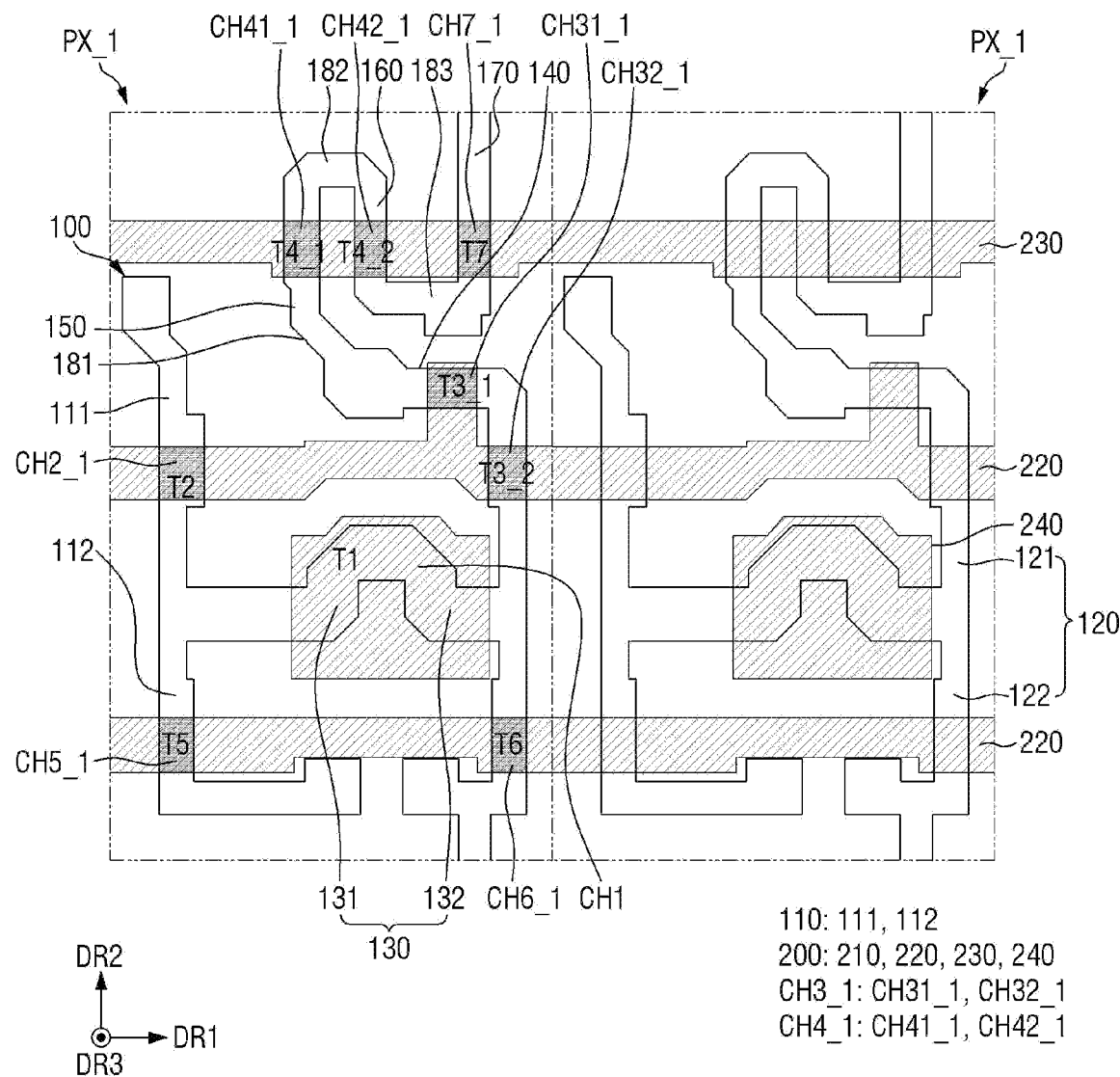
FIG. 13 is a layout view illustrating a semiconductor layer and a first conductive layer of a pixel according to one embodiment.

FIG. 13 is a layout view illustrating a semiconductor layer and a first conductive layer of a pixel according to an embodiment.

Referring to FIG. 13, a channel of a switching transistor of a pixel PX_1 includes phosphorus (P).

The channel CH1 of the first transistor T1 (a driving transistor) may include both a first impurity ion containing a group-III element and a second impurity ion containing a group-V element. Each of the channels CH2_1, CH31 (CH31_1, CH32_1), CH4_1 (CH41_1, CH42_1), CH5_1, CH6_1 and CH7_1 of the second to seventh transistors T2, T3, T4, T5, T6 and T7 may include a second impurity ion containing a group-V element and may not include a first impurity ion containing a group-III element.

The first impurity ion may include a group-III element containing boron (B). The second impurity ion may include a group-V element containing phosphorous (P). Each of the channels CH1, CH2_1, CH31 (CH31_1, CH32_1), CH4_1 (CH41_1, CH42_1), CH5_1, CH6_1 and CH7_1 of the first to seventh transistors T1, T2, T3, T4, T5, T6, and T7 may include phosphorous (P), and the channel CH1 of the first transistor T1 may further include boron (B).

When each of the channels CH2_1, CH31 (CH31_1, CH32_1), CH4_1 (CH41_1, CH42_1), CH5_1, CH6_1 and CH7_1 of the second to seventh transistors T2, T3, T4, T5, T6 and T7 includes phosphorus (P), $H_2$ plasma treatment may be performed on each of the channels CH2_1, CH31 (CH31_1, CH32_1), CH4_1 (CH41_1, CH42_1), CH5_1, CH6_1, and CH7_1. The $H_2$ plasma treatment may be performed at a power of 100 Watts (W) for about 20 seconds. Therefore, each of the channels CH2_1, CH31 (CH31_1, CH32_1), CH4_1 (CH41_1, CH42_1), CH5_1, CH6_1, and CH7_1 may contain/include more $H_2$ than the channel CH1 of the first transistor T1.

The characteristics of the switching transistor may be improved when each of the channels CH2_1, CH31 (CH31_1, CH32_1), CH4_1 (CH41_1, CH42_1), CH5_1, CH6_1, and CH7_1 of the second to seventh transistors T2, T3, T4, T5, T6, and T7 includes phosphorus (P) and is treated with $H_2$ plasma. For example, carrier mobility of a switching transistor is about 72.50, and the driving voltage range (DR range) of the switching transistor is about −2.60. Advantageously, characteristics (including driving speeds) associated with the switching transistors may be satisfactory.

Because the channel of the driving transistor includes dopants that are different from the dopants of the channels of the switching transistors, hysteresis issues and instant afterimage issues may be mitigated, and switching characteristics of the switching transistors may be satisfactory.

Figure 14:
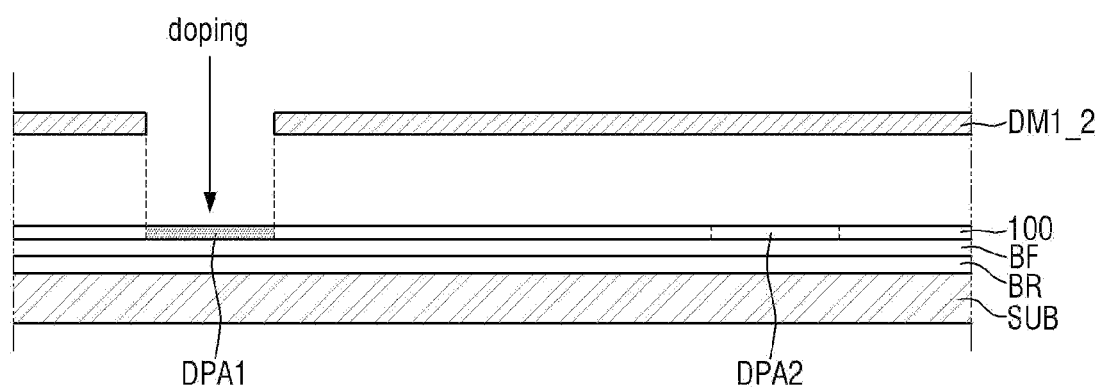
FIG. 14, FIG. 15, and FIG. 16 are cross-sectional views illustrating structures formed in a method of manufacturing a display device according to one embodiment.
Figure 15:
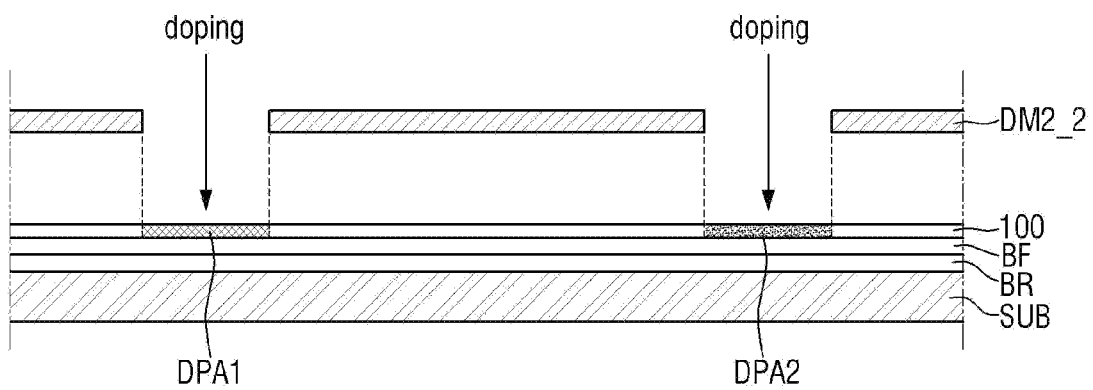
Figure 16:
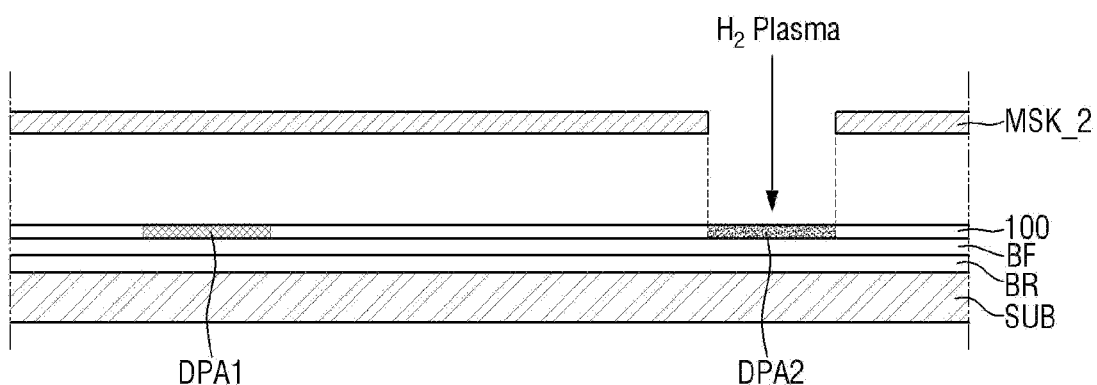

FIGS. 14 to 16 are cross-sectional views illustrating structures formed in a method of manufacturing a display device according to another embodiment.

Referring to FIG. 14, first impurity ions (or first-element impurity ions) are doped on (and into) the first doping area DPA1 of the semiconductor layer 100 through a first doping mask DM1_2 that exposes the first doping area DPA1 and covers the second doping area DPA2. The first impurity ions may include a group-III element, e.g., boron (B). The first doping area DPA1 may include boron (B) after being doped with boron (B) ions. The first doping area DPA1 may correspond to the channel of the driving transistor, and the second doping area DPA2 may correspond to the channel of a switching transistor.

Subsequently, referring to FIG. 15, through a second doping mask DM2_2 that exposes the first doping area DPA1 and the second doping area DPA2, second impurity ions (or second-element impurity ions) are doped on (and into) the first doping area DPA1 and the second doping area DPA2 of the semiconductor layer 100. The second impurity ion may include a group-V element, e.g., phosphorus (P). The first doping area DPA1 and the second doping area DPA2 are doped with phosphorus (P); thus, the first doping area DPA1 may include boron (B) and phosphorus (P), and the second doping area DPA2 may include phosphorus (P). The second doping mask DM2_2 may be optional, and the first doping area DPA1 and the second doping area DPA2 may be simultaneously doped without a doping mask.

The process of FIG. 14 may be performed subsequent to the process of FIG. 15. After the first and second doping areas DPA1 and DPA2 have been doped with second impurity ions, the first doping area DPA1 may be doped with first impurity ions.

Subsequently, referring to FIG. 16, through a pattern mask MSK that covers the first doping area DPA1 and exposes the second doping area DPA2, the second doping area DPA2 is treated with $H_2$ plasma. The $H_2$ plasma treatment process of FIG. 16 may be optional.

The processes of FIGS. 14 to 16 described above may be included in a method of manufacturing a display device that includes structures illustrated in FIG. 13.

What is claimed is:

1. A display device comprising:
   a substrate;
   a semiconductor layer disposed on the substrate, comprising a channel of a first transistor, and comprising a channel of a second transistor;
   a first insulating layer disposed on the semiconductor layer; and
   a first conductive layer disposed on the first insulating layer, comprising a gate electrode of the first transistor, and comprising a gate electrode of the second transistor,
   wherein the channel of the first transistor comprises a first first-element impurity ion and a second-element impurity ion different from the first first-element impurity ion,
   wherein the channel of the second transistor comprises a second first-element impurity ion identical to the first first-element ion, and
   wherein the semiconductor layer extends continuously in a pixel to form the channel of the first transistor and the channel of the second transistor.

2. The display device of claim 1, wherein the first first-element impurity ion includes a group-III element, and wherein the second-element impurity ion includes a group-V element.

3. The display device of claim 2, wherein the first first-element impurity ion includes boron (B), and wherein the second-element impurity ion includes phosphorus (P).

4. The display device of claim 1, wherein the first first-element impurity ion includes a group-V element, and wherein the second-element impurity ion includes a group-III element.

5. The display device of claim 4, wherein the first first-element impurity ion includes phosphorus (P), and wherein the second-element impurity ion includes boron (B).

6. The display device of claim 5, wherein the channel of the second transistor includes hydrogen.

7. The display device of claim 6, wherein the channel of the second transistor includes more hydrogen than the channel of the first transistor.

8. The display device of claim 1, wherein the first transistor comprises a first electrode and a second electrode, and wherein the second transistor is disposed between the second electrode of the first transistor and the gate electrode of the first transistor.

9. The display device of claim 8, further comprising:
   a first power voltage line electrically connected to the first electrode of the first transistor; and
   a light emitting element electrically connected to the second electrode of the first transistor.

10. A display device comprising:
    a first power voltage line;
    a light emitting element;
    a first transistor comprising a first electrode, a second electrode, a gate electrode, and a channel, wherein the first electrode of the first transistor is electrically connected to the first power voltage line, wherein the second electrode of the first transistor is electrically connected to the light emitting element, wherein the gate electrode of the first transistor overlaps the channel of the first transistor, and wherein the channel of the first transistor comprises a first first-element impurity ion and a second-element impurity ion different from the first first-element impurity ion; and
    a second transistor disposed between the second electrode of the first transistor and the gate electrode of the first transistor and comprising a channel, wherein the channel of the second transistor comprises a second first-element impurity ion identical to the first first-element impurity ion.

11. The display device of claim 10, wherein the first first-element impurity ion includes a group-III element, and wherein the second-element impurity ion includes a group-V element.

12. The display device of claim 11, wherein the first first-element impurity ion includes boron (B), and wherein the second-element impurity ion includes phosphorus (P).

13. The display device of claim 10, wherein the first first-element impurity ion includes a group-V element, and wherein the second-element impurity ion includes a group-III element.

14. The display device of claim 13, wherein the first first-element impurity ion includes phosphorus (P), and wherein the second-element impurity ion includes boron (B).

15. The display device of claim 10, further comprising:
    a data line; and
    a third transistor disposed between the data line and the first electrode of the first transistor and comprising a channel, wherein a material of the channel of the third transistor is identical to a material of the channel of the second transistor.

* * * * *